United States Patent
Chang

(10) Patent No.: US 9,481,564 B2
(45) Date of Patent: Nov. 1, 2016

(54) METHOD OF SEALING AND SHIELDING FOR DUAL PRESSURE MEMS DEVICES

(71) Applicant: Taiwan Semiconductor Manufacturing Co., Ltd., Hsin-Chu (TW)

(72) Inventor: Kuei-Sung Chang, Kaohsiung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 14/698,985

(22) Filed: Apr. 29, 2015

(65) Prior Publication Data

US 2015/0232326 A1  Aug. 20, 2015

Related U.S. Application Data

(63) Continuation-in-part of application No. 14/013,155, filed on Aug. 29, 2013, now Pat. No. 9,029,961.

(51) Int. Cl.
  *B81B 7/00* (2006.01)
  *B81C 1/00* (2006.01)
  *B81B 7/02* (2006.01)

(52) U.S. Cl.
  CPC .............. *B81B 7/0041* (2013.01); *B81B 7/02* (2013.01); *B81C 1/00269* (2013.01); *B81C 1/00333* (2013.01); *B81B 2201/0235* (2013.01); *B81C 2203/0109* (2013.01); *B81C 2203/0145* (2013.01)

(58) Field of Classification Search
  CPC .. B81B 7/02; B81C 2203/019; B81C 1/0023
  See application file for complete search history.

(56) References Cited

U.S. PATENT DOCUMENTS

| | | | |
|---|---|---|---|
| 7,659,150 B1 | 2/2010 | Monadgemi et al. | |
| 8,580,594 B2 | 11/2013 | Huang et al. | |
| 2011/0215435 A1 | 9/2011 | Wakimoto et al. | |
| 2012/0043627 A1 | 2/2012 | Lin et al. | |
| 2012/0326248 A1* | 12/2012 | Daneman | B81B 7/02 257/415 |

(Continued)

FOREIGN PATENT DOCUMENTS

| | | |
|---|---|---|
| CN | 101643193 A | 2/2010 |
| WO | 2013064632 A1 | 5/2013 |

OTHER PUBLICATIONS

Martin Tarr, "Hermatic Encapsulation," Website, 2009, Figure 1, http://www.mtarr.co.uk/courses/topics/0261_herm/index.html#top.

(Continued)

*Primary Examiner* — Roy Potter
*Assistant Examiner* — Paul Patton
(74) *Attorney, Agent, or Firm* — Eschweiler & Associates, LLC

(57) ABSTRACT

The present disclosure relates to a MEMs substrate. In some embodiments, the MEMs substrate has a device substrate having a micro-electromechanical system (MEMs) device, and a layer of bonding material positioned over the device substrate at positions adjacent to the MEMs device. A cap substrate has a depression is disposed within a surface abutting the layer of bonding material. The depression within the cap substrate forms a chamber vertically disposed between the device substrate and the cap substrate and abutting the MEMs device. One or more pressure tuning channels are vertically disposed between the device substrate and the cap substrate and laterally extend outward from a sidewall of the chamber.

20 Claims, 18 Drawing Sheets

(56) References Cited

U.S. PATENT DOCUMENTS

| | | |
|---|---|---|
| 2013/0001710 A1 | 1/2013 | Daneman et al. |
| 2013/0037891 A1 | 2/2013 | Huang et al. |
| 2013/0099355 A1 | 4/2013 | Liu et al. |
| 2013/0265701 A1 | 10/2013 | Takizawa |
| 2013/0277770 A1 | 10/2013 | Tsai et al. |
| 2014/0103461 A1 | 4/2014 | Chu et al. |
| 2014/0225206 A1 | 8/2014 | Lin et al. |
| 2014/0248730 A1 | 9/2014 | Huang et al. |

OTHER PUBLICATIONS

U.S. Appl. No. 14/013,155, filed Aug. 29, 2013.
Non-Final Office Action dated Aug. 13, 2014 for U.S. Appl. No. 14/013,155.
Notice of Allowance dated Jan. 13, 2015 for U.S. Appl. No. 14/013,155.
U.S. Appl. No. 14/041,298, filed Sep. 30, 2013.
Non-Final Office Action dated Oct. 6, 2014 for U.S. Appl. No. 14/041,298.
Notice of Allowance dated Jan. 22, 2015 for U.S. Appl. No. 14/041,298.
U.S. Appl. No. 14/557,513, filed Dec. 2, 2014.
U.S. Appl. No. 14/629,738, filed Feb. 24, 2015.
Non-Final Office Action dated Apr. 8, 2016 for U.S. Appl. No. 14/629,738.
Non Final Office Action Dated Jul. 5, 2016 U.S. Appl. No. 14/557,513.

\* cited by examiner

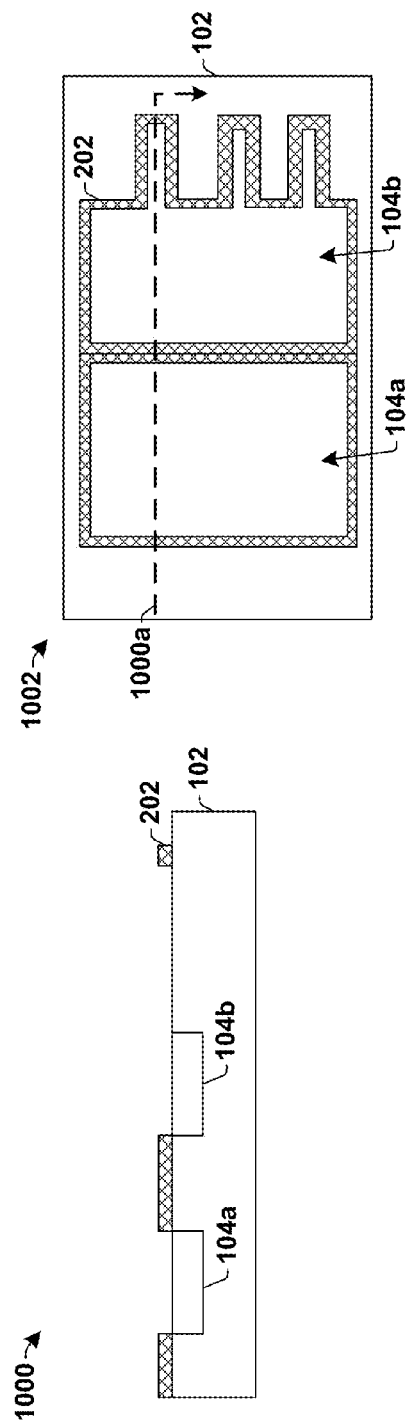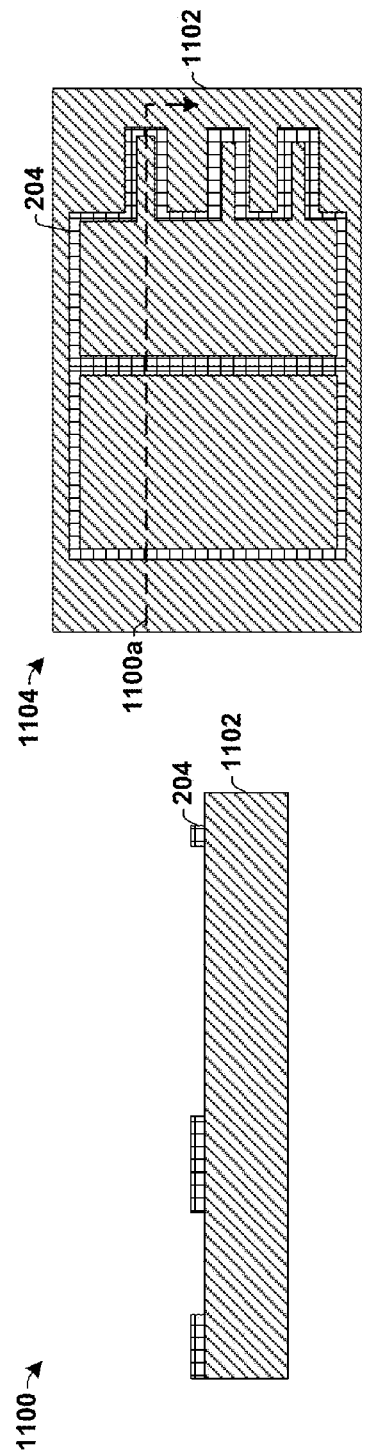
Fig. 10
Fig. 11

US 9,481,564 B2

METHOD OF SEALING AND SHIELDING FOR DUAL PRESSURE MEMS DEVICES

REFERENCE TO RELATED APPLICATION

This application is a continuation-in-part of U.S. application Ser. No. 14/013,155 filed on Aug. 29, 2013.

BACKGROUND

MEMs (micro-electromechanical system) devices, such as accelerometers, pressure sensors, gyroscopes, etc., have found widespread using in many modern day electronic devices. For example, MEMs accelerometers are commonly found in automobiles (e.g., in airbag deployment systems), tablet computers, cell phones, etc.

In recent years, it is increasingly common for micro-electromechanical system (MEMs) devices to be incorporated into integrated chips formed by a complementary metal-oxide-semiconductor (CMOS) process. The incorporation of MEMs devices (e.g., sensors, integrated optics, bio-chips, etc.) into a CMOS process allows for widespread use of MEM devices fabricated with a high throughput.

BRIEF DESCRIPTION OF THE DRAWINGS

FIGS. 10-19 illustrate some embodiments of a substrate upon which a method forming a plurality of MEMs devices abutting chambers held at different pressures is performed

DETAILED DESCRIPTION

Figure 1A:
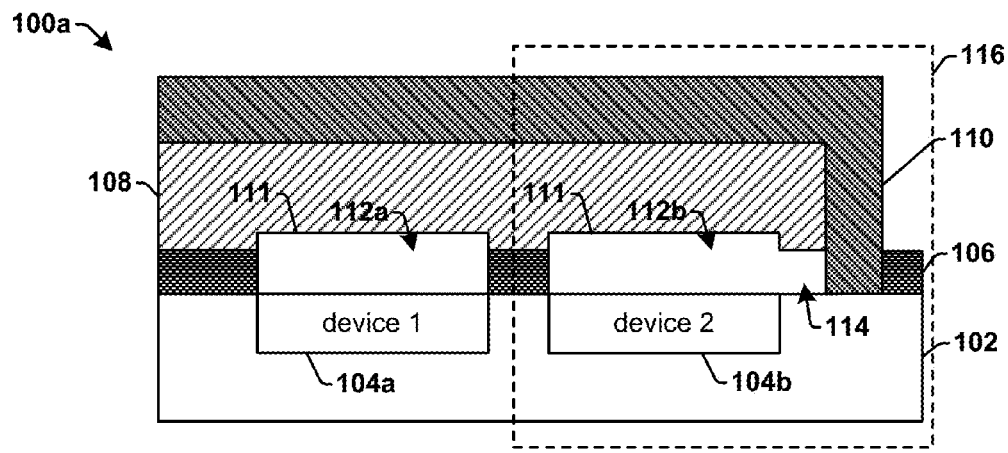
FIGS. 1A-1B illustrate some embodiments of a substrate comprising MEMs (micro-electromechanical system) devices abutting chambers held at different pressures.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

MEMs devices often operate in a manner that is dependent on an environment surrounding the device. For example, to measure an angular momentum, a MEMs vibrational gyroscope may measure an angular rate by utilizing the Coriolis effect. To improve operation of a MEMs device, it may be desirable to operate the MEMs device within a surrounding environment that has a specific pressure that enables improved measurement of a desired parameter. For example, in the case of a MEMs vibrational gyroscope, a surrounding environment having a relatively low pressure (i.e., a higher vacuum) is desirable since it provides for a better measurement since it enhances displacement that is converted to a signal. Conversely, in the case of a MEMs accelerometer, a surrounding environment having a relatively high pressure is desirable since it mitigates displacement due to background disturbances that are converted to noise.

Therefore, MEMs devices typically abut a hermetically-sealed chamber that is held at a controlled pressure level that enables optimized operation of the device. The pressure level can range from a vacuum (e.g., 1 mtorr) to a few atmosphere (e.g., 2 atm) depending on a device type. When there is one MEMs device (e.g., an accelerometer) on a wafer, a wafer level method can be used to form the cavity under a pressure. However, when there are a plurality of different types of MEMs devices on a same wafer (e.g., an accelerometer and gyroscope) the wafer level method is unable to package the MEMs devices to abut chambers held at separate pressures.

Accordingly, the present disclosure relates to a method of forming a plurality of MEMs devices respectively abutting chambers held at different pressures on a same substrate, and an associated apparatus. In some embodiments, the method comprises providing a device substrate having a plurality of micro-electromechanical system (MEMs) devices. A cap substrate is bonded onto the device substrate in a first ambient environment having a first pressure. The bonding forms a plurality of chambers abutting the plurality of MEMs devices. One or more pressure tuning channels are formed in a sidewall of one of the plurality of chambers. Vent holes in communication with the one or more pressure tuning channels can be formed through the cap substrate within a second ambient environment having a different, second pressure. The one or more vent holes expose the one of the plurality of chambers to the second pressure. The one or more pressure tuning channels are then sealed, so that the second chamber is held at the second pressure. The resulting substrate comprises a first chamber held at a first pressure and a second chamber held at a different, second pressure.

Figure 1B:
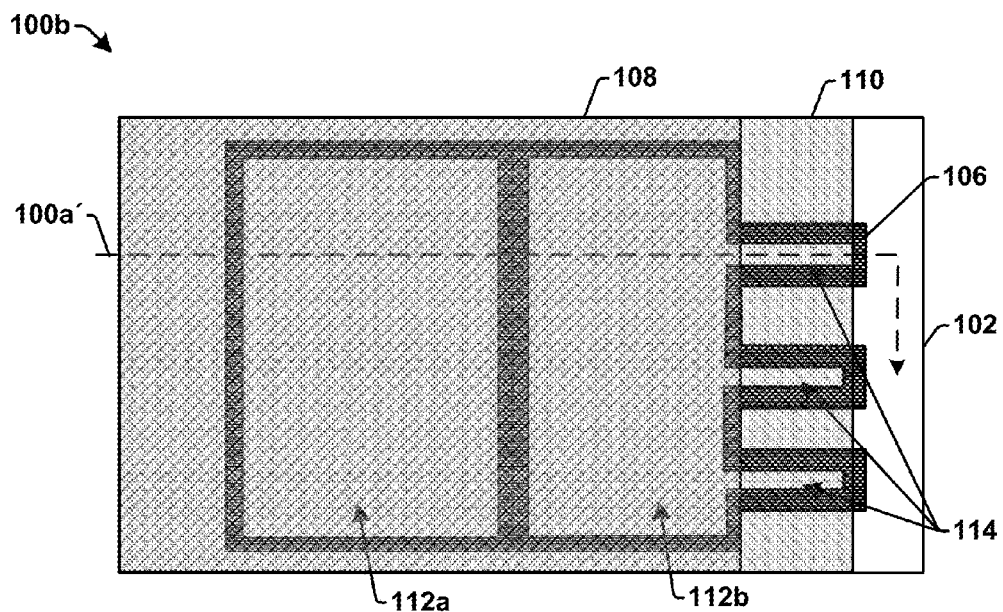

FIGS. 1A-1B illustrates some embodiments of a substrate comprising two MEMs (micro-electromechanical system) devices abutting chambers held at different pressures.

FIG. 1A illustrates a block diagram of a cross-sectional view 100a of some embodiments of a substrate (along cross-sectional line 100a' of FIG. 1B) comprising a plurality of MEMs devices abutting chambers held at different pressures.

The substrate comprises a device substrate 102 having a plurality of MEMs (micro-electromechanical systems) devices, 104a and 104b, embedded therein. In some embodiments, one or more of the MEMs devices, 104a and 104b, may comprise a MEMs gyroscope (e.g., a vibrating gyroscope or a piezoelectric plate gyroscope), a MEMs accelerometer, or a MEMs pressure sensor, for example.

A cap substrate 108 is disposed at a position overlaying the device substrate 102. The cap substrate 108 is affixed to the device substrate 102 by way of a bonding material 106. The cap substrate 108 comprises a plurality of depressions 111 that are positioned at locations that correspond to locations of the MEMs devices, 104a and 104b, so as to form chambers, 112a and 112b. It will be appreciated the term 'substrate', as used herein, refers in general to any sized or shaped substrates. For example, the cap substrate 108 may comprise a wafer or a section or subset of a wafer (e.g., a die).

The chambers, 112a and 112b, abut the MEMs devices, 104a and 104b (e.g., the first MEMs device 104a abuts a first chamber 112a and the second MEMs device 104b abuts a second chamber 112b). In some embodiments, the first chamber 112a may comprise a top surface comprising the cap substrate 108 and sidewalls comprising the cap substrate 108 and the bonding material 106. In some embodiments, a sealant 110 is disposed to overlay the cap substrate 108 and extend from a top of the cap substrate 108 to a position that forms an interior surface of the second chamber 112b. In some embodiments, the MEMs devices, 104a and 104b, may have a movable component in contact with the chambers, 112a and 112b.

The first chamber 112a is held at a first pressure, and the second chamber 112b is held at a second pressure that may be different than the first pressure. One or more pressure tuning channels 114 are vertically disposed between the device substrate 102 and the cap substrate 108 and laterally extend outward from a sidewall of the second chamber 112b. The sealant 110 extends into the pressure tuning channels 114 to hermetically seal the second chamber 112b from an ambient environment.

It will be appreciated that although the substrate of FIG. 1A is illustrated as having two chambers, 112a and 112b, that are held at different pressures that the disclosed substrate is not limited to such a configuration. For example, in other embodiments, a disclosed substrate may comprise more than two chambers, wherein two or more of the chambers may be held at a same pressure. Furthermore, although the substrate is illustrated as having 2 MEMs devices, it will be appreciated that the substrate may be diced to provide for two separate MEMs substrates respectively having one or more MEMs devices. For example, the substrate may be diced to provide a substrate having a single MEMs device (e.g., second MEMs device 104b) abutting the second chamber 112b, as shown by box 116.

FIG. 1B illustrates a block diagram of a top-view 100b of some embodiments of a substrate comprising a plurality of MEMs devices abutting chambers held at different pressures.

As shown in top-view 100b, the first chamber 112a and the second chamber 112b are laterally separated by the bonding material 106. The second chamber 112b comprises one or more pressure tuning channels 114 that extend outward from a sidewall of the second chamber 112b. In some embodiments, the one or more pressure tuning channels 114 may be defined by the bonding material 106 (e.g., by a patterned bonding material formed on a substantially flat section of the cap substrate), such that the one or more pressure tuning channels 114 have a height that is equal to a thickness of the bonding material 106 (e.g., so that the one or more pressure tuning channels 114 have a height that is less than a height of the chambers 112). In other embodiments, the one or more pressure tuning channels 114 may comprise depressions within the device substrate 102 and/or the cap substrate 108, such that the one or more pressure tuning channels 114 have a height that depends upon a depth of the depressions.

Figure 2A:
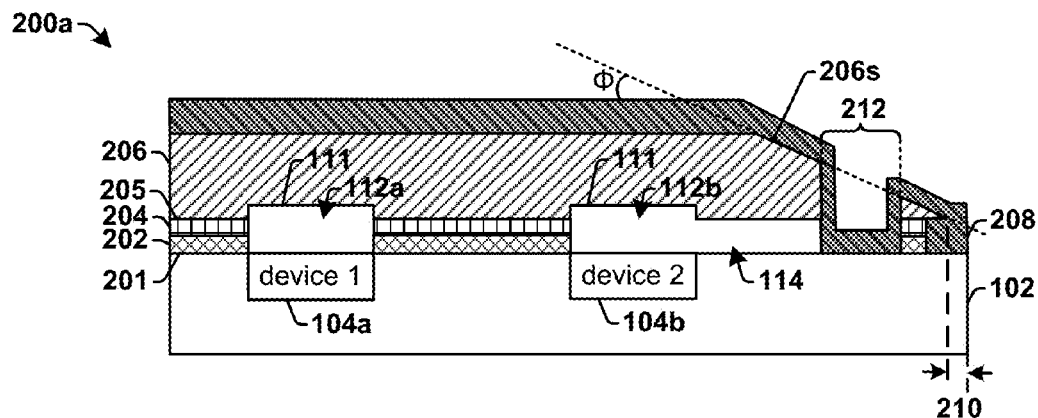
FIGS. 2A-2B illustrate some additional embodiments of a substrate comprising MEMs devices abutting chambers held at different pressures.
Figure 2B:
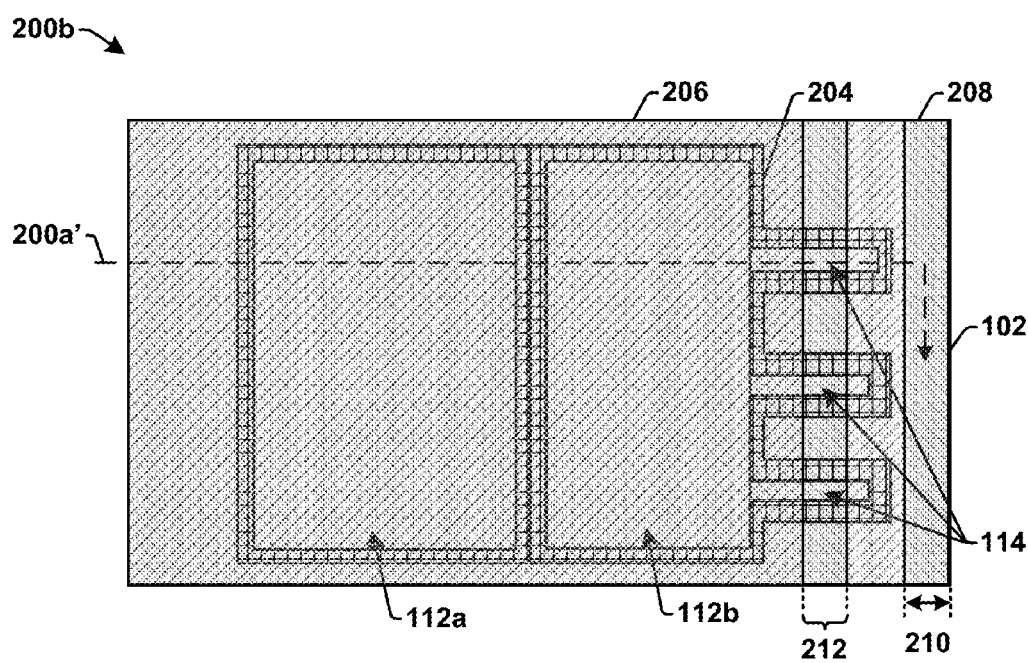

FIGS. 2A-2B illustrate some more detailed embodiments of a substrate comprising a plurality of MEMs devices having cavities held at different pressures.

FIG. 2A illustrates a cross-sectional view 200a of some embodiments of a substrate (along cross-sectional line 200a' of FIG. 2B) comprising a plurality of MEMs devices abutting chambers held at different pressures.

The substrate comprises a device substrate 102 having a plurality of MEMs devices, 104a and 104b. The MEMs devices, 104a and 104b, are laterally positioned between sections of a first layer of bonding material 202 disposed on an upper surface 201 of the device substrate 102. In some embodiments, one or more of the plurality of MEMs devices, 104a and 104b, may comprise a MEMs gyroscope such as a vibrating gyroscope or a piezoelectric plate gyroscope. In other embodiments, one or more of the plurality of MEMs devices, 104a and 104b, may comprise a MEMs accelerometer. In some embodiments, the first layer of bonding material 202 may comprise aluminum or germanium (for a eutectic bond), oxide (for a fusion bond), or a metal or a polymer (for a thermal compression bond).

In some embodiments, the device substrate 102 may comprise electrical interconnections (not shown) configured to couple the MEMs devices, 104a and 104b, to one or more logic devices (e.g., CMOS transistors) that make the MEMs devices, 104a and 104b, function. For example, in some embodiments, the device substrate 102 might be a CMOS substrate comprising one or more CMOS devices (e.g., MOSFET devices). In such embodiments, the MEMS devices, 104a and 104b, may be built along an upper surface of the device substrate 102 (e.g., within the semiconductor material or within an inter-level dielectric layer overlying the CMOS devices). In other embodiments, the device substrate 102, comprising MEMS devices, 104a and 104b, may be bonded to an underlying CMOS substrate comprising one or more CMOS devices. In yet embodiments, the device substrate 102 may comprise one or more stacked substrates (e.g., a 2.5D integrated chip), wherein one or more of the stacked substrates comprise one or more logic devices that make the MEMs devices, 104a and 104b, function.

A cap substrate 206 is located over the device substrate 102. The cap substrate 206 comprises a lower surface 205 that faces the upper surface 201 of the device substrate 102. In some embodiments, the lower surface 205 comprises a plurality of depressions 111 that extend into the lower surface 205 of the cap substrate 206 as negative reliefs. In such embodiments, the plurality of depressions 111 may comprise a plurality of device cavities. In some embodiments, the plurality of depressions 111 may further comprise one or more pressure tuning cavities that extend outward from one or more of the plurality of device cavities. The plurality of depressions 111 are laterally positioned between a second layer of bonding material 204 disposed on the surface 205 of the cap substrate 206. In some embodiments, the second layer of bonding material 204 may comprise aluminum or germanium (for a eutectic bond), oxide (for a fusion bond), or a metal or a polymer (for a thermal compression bond). In other embodiments, the lower surface 205 of the cap substrate 206 may be substantially planar.

The cap substrate 206 extends over a portion of the device substrate 102. In some embodiments, the cap substrate 206 is set back from an edge of the device substrate 102 (e.g., by a distance 210) due to dicing the cap substrate 206 at an angle during fabrication. In some embodiments, the cap substrate 206 has an angled sidewall 206s. In some embodiments, the angled sidewall 206s has an angle $\phi$ that is in a range of between approximately 45° and approximately 90°. One or more pressure tuning channels 114 are located at a position(s) underlying the angled sidewall of the cap substrate 206. One or more vent holes 212 extend through the cap substrate 206 to a position in communication with the one or more pressure tuning channels 114. A sealant 208 is disposed over the cap substrate 206 and extends to positions within the one or more vent holes 212. In some embodiments, the sealant 208 may comprise a metal and/or a dielectric material (e.g., a metal layer, a dielectric layer, a metal/dielectric stack, a dielectric/metal/dielectric stack, etc.).

The first and second layers of bonding material, 202 and 204, are positioned to contact one another so as to form a first chamber 112a and a second chamber 112b. The second chamber 112b is connected to one or more pressure tuning channels 114. In embodiments in which the lower surface 205 of the cap substrate 205 comprises a plurality of depressions 111, the chambers 112 and/or the pressure tuning channels 114 may comprise the plurality of depressions 111 (i.e., so that the chambers 112 and/or the pressure tuning channels 114 extend into the cap substrate 205). In embodiments in which the lower surface of the cap substrate 205 is planar, the chambers 112 and/or the pressure tuning channels 114 are formed by patterning the first layer of bonding material 202 and/or the second layer of bonding material 204.

The first MEMs device 104a abuts the first chamber 112a, which is held at a first pressure. The second MEMs device 104b abuts the second chamber 112b, which is held at a second pressure. In some embodiments, the first pressure is different than the second pressure. The different pressures of the first and second chambers, 112a and 112b, allow for MEMs devices, 104a and 104b, to comprise different types of MEMs devices. For example, in some embodiments, the first MEMs device 104a comprises an accelerometer abutting the first chamber 112a held at the first pressure, while the second MEMs device 104b comprises a gyroscope abutting the second chamber 112b held at the second pressure.

FIG. 2B illustrates a top-view 200b of some embodiments of the substrate illustrated in the cross-sectional view 200a of FIG. 2A (wherein FIG. 2A is illustrated along cross-sectional line 200a').

The substrate comprises a first chamber 112a and a second chamber 112b. The first chamber 112a is surrounded by the second layer of bonding material 204. In some embodiments, the first chamber 112a is surrounded by the second layer of bonding material 204, which is disposed in a substantially rectangular pattern. The second chamber 112b is surrounded by the second layer of bonding material 204. In some embodiments, the second chamber 112b is surrounded by second layer of bonding material 204, which is disposed in a substantially rectangular pattern with pressure tuning channels 114 extending as conduits outward from the rectangular pattern (e.g., as finger-like conduits). It will be appreciated that the rectangular pattern of the second layer of bonding material 204 is a non-limiting embodiment, and that in other embodiments, the second layer of bonding material 204 may be dispensed in another, non-rectangular pattern.

In some embodiments, the one or more vent holes 212 may comprise a trench that extends past multiple pressure tuning channels 114. The trench is positioned so that the cap substrate 206 is configured to overlay the first chamber 112a and the second chamber 112b, but to expose a portion of the pressure tuning channels 114. The sealant 208 is disposed within the trench so that the second chamber 112b is separated from an ambient environment by the sealant 208.

Figure 3A:
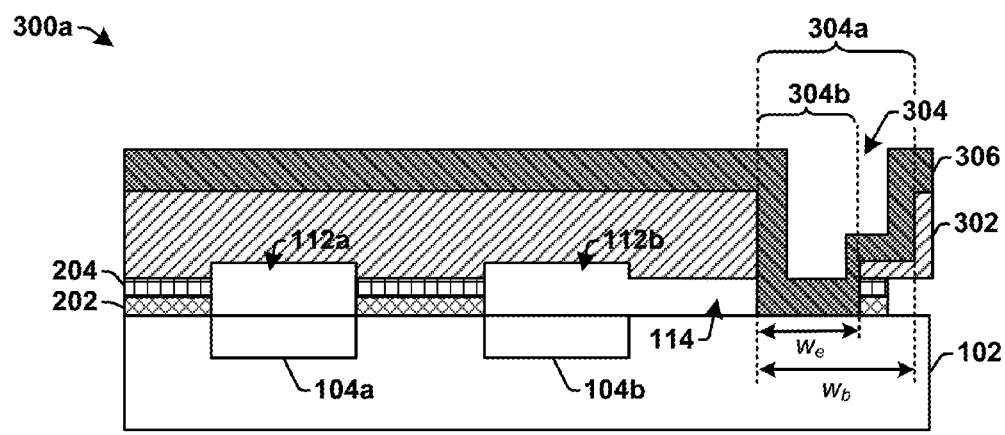
FIGS. 3A-3B illustrate some alternative embodiments of a substrate comprising MEMs devices abutting chambers held at different pressures.
Figure 3B:
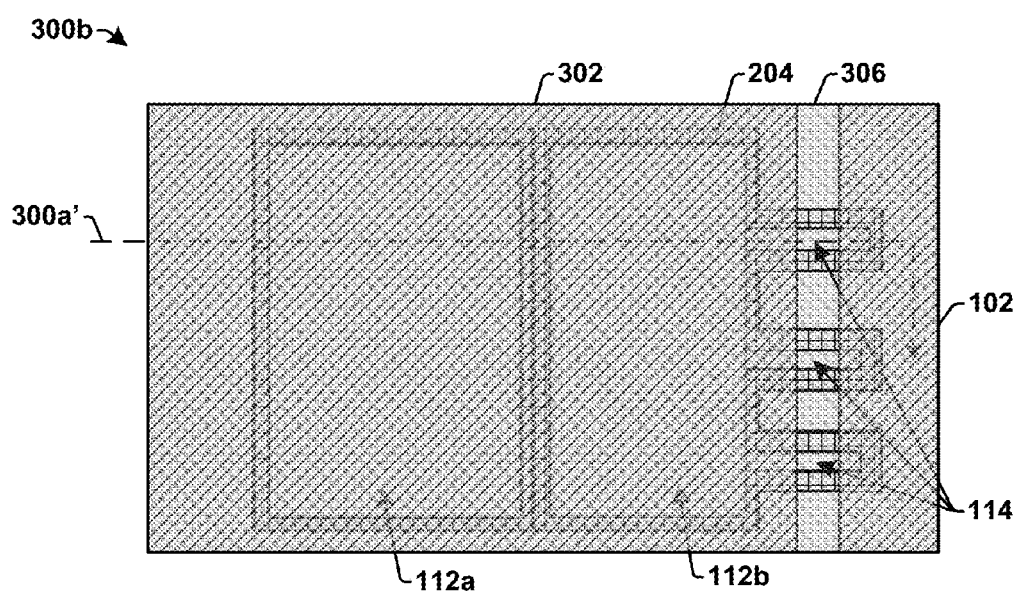

FIGS. 3A-3B illustrates some alternative embodiments of a substrate comprising MEMs devices abutting chambers held at different pressures.

FIG. 3A illustrates a cross-sectional view 300a of some embodiments of a substrate (along cross-sectional line 300a' of FIG. 3B) comprising a plurality of MEMs devices abutting chambers held at different pressures.

The substrate comprises a cap substrate 302 disposed over a device substrate 102. The cap substrate 302 has a vertical sidewall that is aligned with an edge of the device substrate 102. One or more vent holes 304 vertically extend through the cap substrate 302 to a pressure tuning channel 114. In some embodiments, the one or more vent holes 304 have a first opening with a width $w_b$ that is substantially equal to a width of a wafer saw blade (e.g., between approximately 5 um and approximately 100 um). In other embodiments, the one or more vent holes 304 have a first opening 304a and a second opening 304b underlying the first opening 304a. The first opening 304a has a first width $w_b$ and the second opening 304b has a second width $w_e$ that is less than the first width $w_b$, so as to give the one or more vent holes 304 a stepped sidewall. A sealant 306 extends into the one or more vent holes 304 to fill the one or more vent holes 304 and to thereby hermetically seal the second chamber 112b.

FIG. 3B illustrates a top-view 300b of some embodiments of the substrate illustrated in the cross-sectional view 300a of FIG. 3A.

Figure 4A:
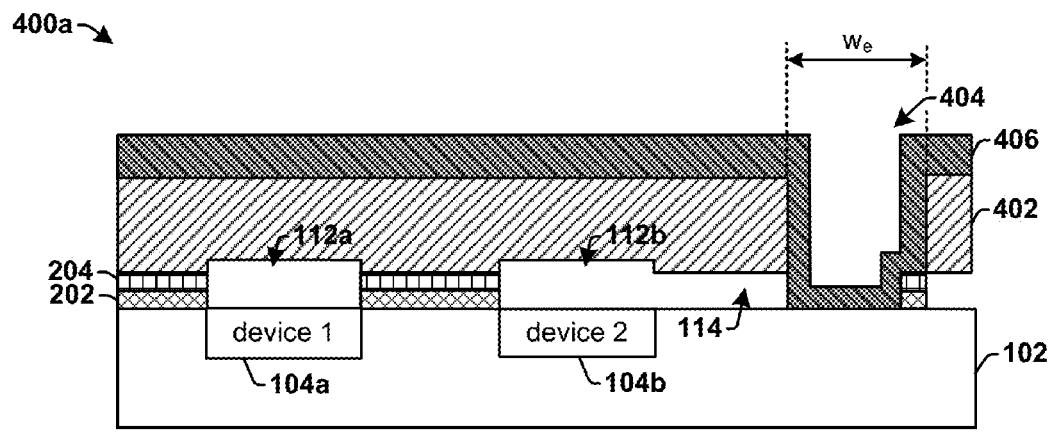
FIGS. 4A-4B illustrate some alternative embodiments of a substrate comprising MEMs devices abutting chambers held at different pressures.
Figure 4B:
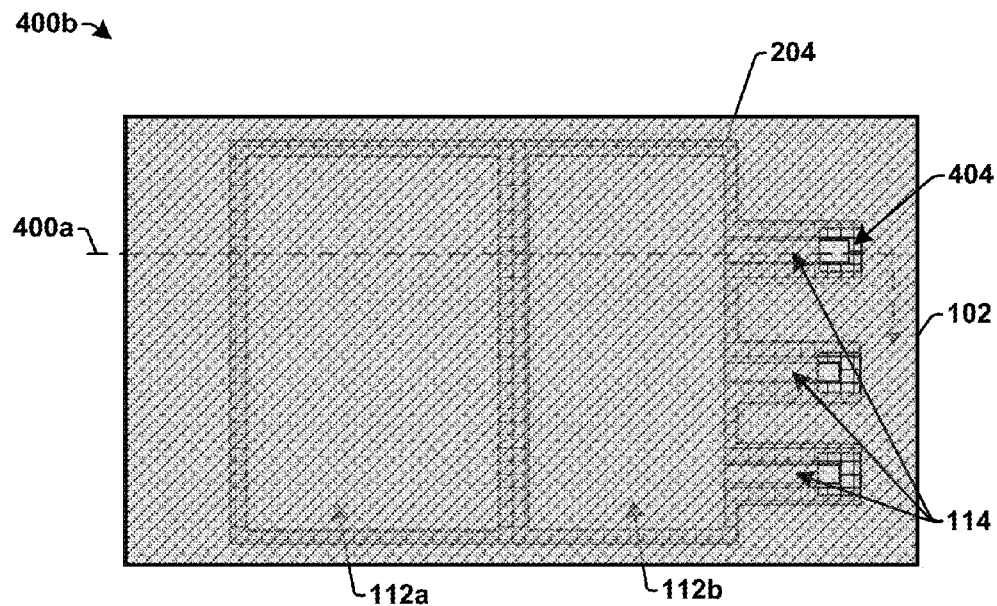

FIGS. 4A-4B illustrates some alternative embodiments of a substrate comprising a MEMs devices having a opening formed by an etching process.

FIG. 4A illustrates a cross-sectional view 400a of some embodiments of a substrate (along cross-sectional line 400a' of FIG. 4B) comprising a plurality of MEMs devices abutting chambers held at different pressures.

As shown in cross-sectional view 400a, the substrate comprises a cap substrate 402 disposed over a device substrate 102. One or more vent holes 404 vertically extend through the cap substrate 402 to a pressure tuning channel 114. The one or more vent holes 404 have substantially vertical sidewalls that extend through the cap substrate 402. In some embodiments, the one or more vent holes 404 may have a width $w_e$ that is less than a width of a wafer saw blade $w_b$.

FIG. 4B illustrates a top-view 400b of some embodiments of the substrate illustrated in the cross-sectional view 400a FIG. 4A. As shown in top-view 400b, the one or more vent holes 404 are respectively located over a pressure tuning channel 114. In some embodiments, the one or more vent holes 404 are separated from one another. In other embodiments, the one or more vent holes may comprise a trench that extends over a plurality of pressure tuning channels 114.

Figure 5A:
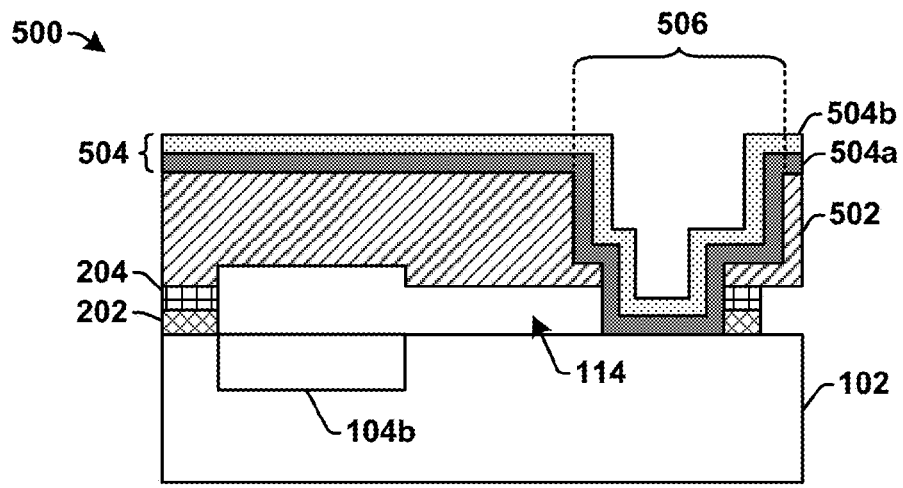
FIGS. 5A-5B illustrate some embodiments of a MEMs substrate having a multi-layer sealant.
Figure 5B:
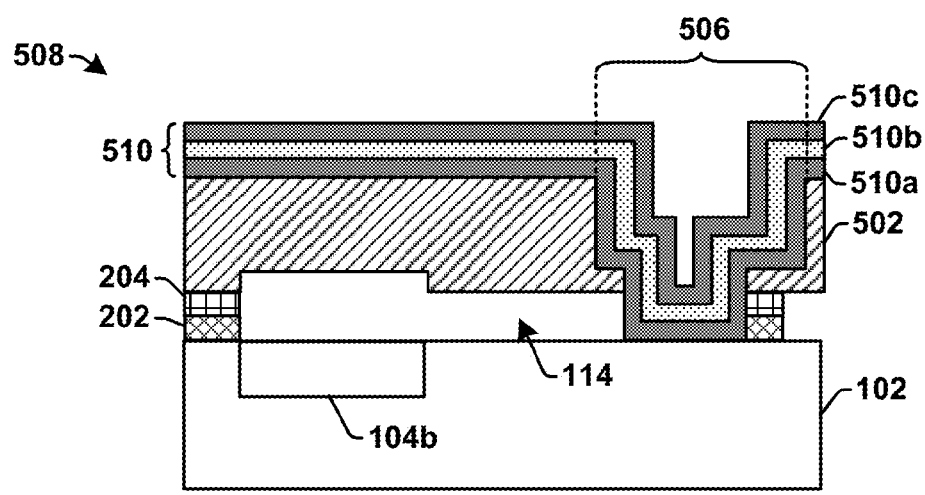

FIGS. 5A-5B illustrate cross-sectional views of MEMs devices comprising a multi-layered sealant configured to seal one or more pressure tuning channels. The multi-layered sealant improves the ability of the sealant to fill openings having a high aspect ratio (e.g., a depth/width ratio of greater than or equal to approximately 1). For example, a multi-layered sealant having a metal layer and a dielectric layer provides for better sealing and for higher reliability.

FIG. 5A illustrates a MEMs substrate 500 comprising a multi-layered sealant 504 configured to seal one or more vent holes 506 within a cap substrate 502. The multi-layered sealant 504 comprises a metal layer 504a and a dielectric layer 504b. In some embodiments, the metal layer 504a may overlie the dielectric layer 504b, while in other embodiments the dielectric layer 504b may overlie the metal layer 504a. In various embodiments, the metal layer 504a may comprise aluminum and/or copper and the dielectric layer 504b may comprise an oxide and/or nitride.

FIG. 5B illustrates a MEMs substrate 508 comprising a multi-layered sealant 510 configured to seal one or more vent holes 506 within a cap substrate 502. The multi-layered sealant 510 comprises a sandwich structure comprising a metal layer 510b disposed between a first dielectric layer 510a and a second dielectric layer 510c. In various embodiments, the first and second dielectric layers, 510a and 510b, may comprise an oxide or a nitride, and the metal layer 510b may comprise aluminum and/or copper.

Figure 6A:
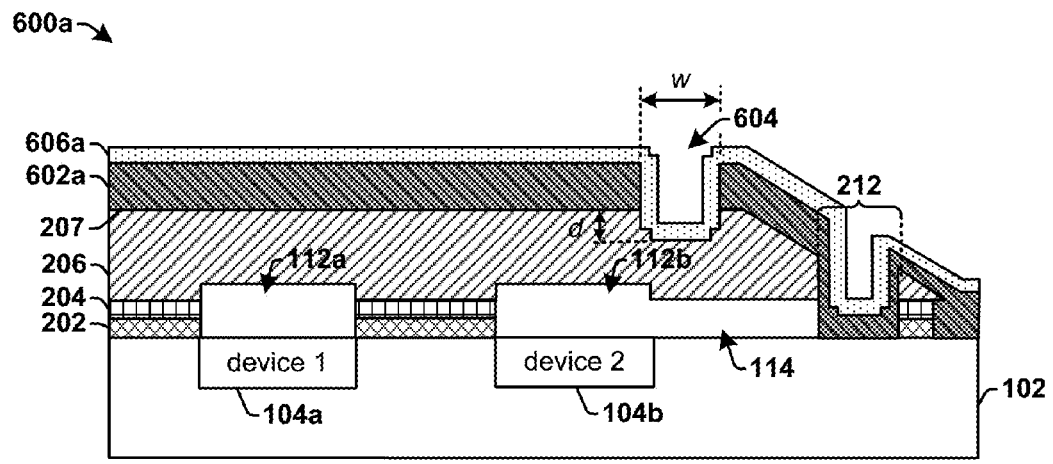
FIGS. 6A-7B illustrate some embodiments of a MEMs substrate having a shielding layer overlying a sealant layer.
Figure 6B:
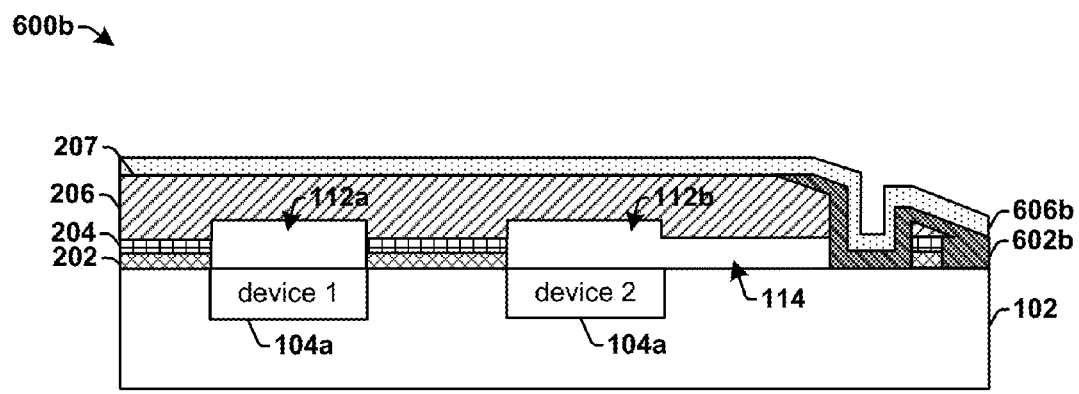

FIGS. 6A-6B illustrates cross-sectional views, 600a and 600b, of some embodiments of a MEMs substrate comprising a shielding layer.

The MEMs substrate comprises a shielding layer 606 disposed over a sealant 602 extending into one or more vent holes in a cap substrate 206. The shielding layer 606 comprises a conductive material that laterally extends over the MEMs devices, 104a and 104b. In some embodiments, the shielding layer may comprise a metal such as aluminum and/or copper, for example. The shielding layer 606 may abut the cap substrate 206 and the sealant 602. By abutting the cap substrate 206, the shielding layer 606 forms an electrical connection with the cap substrate 206, thereby allowing for the shielding layer 606 to be grounded.

By grounding the shielding layer 606, the shielding layer 606 is able to perform electromagnetic shielding by dissipating energy from electro-magnetic fields. The electromagnetic shielding allows for the shielding layer to provide shielding from interference caused by the interaction of electromagnetic radiation between the MEMs devices 104 and an external circuit. For example, in some embodiments, the MEMs substrate may be integrated within an electronic device (e.g., a cell phone, a computer, etc.) having other electronic components. The other electronic components may generate electromagnetic radiation that interferes with operation of the MEMs devices 104 and/or may have their operation interfered with by electromagnetic radiation generated by the MEMs devices 104. The shielding layer 606 dissipates electric currents generated from external or internal electromagnetic fields, and thus mitigating electromagnetic interference.

In some embodiments, shown in cross-sectional view 600a of FIG. 6A, the shielding layer 606a vertically extends through an opening 604 in the sealant 602a to abut an upper surface of the cap substrate 206. The opening 604 is laterally offset from a vent hole 212. In some embodiments, the opening 604 may extend a distance d into an upper surface 207 of the cap substrate 206 so as to form a depression within the top surface of the cap substrate 206. In some embodiments, the opening 604 may comprise a trench having a width w of between 5 um and 100 um. In other embodiments, the opening 604 may comprise a smaller width w.

In other embodiments, shown in cross-sectional view 600b of FIG. 6B, the upper surface 207 of the cap substrate 206 is exposed along a substantially planar surface that is shared with an upper surface of the sealant 602b. The shielding layer 606b is disposed along the planar surface so that the shielding layer 606b abuts upper surfaces of the cap substrate 206 and the sealant 602b, and one or more sidewalls of the cap substrate 206.

Figure 7A:
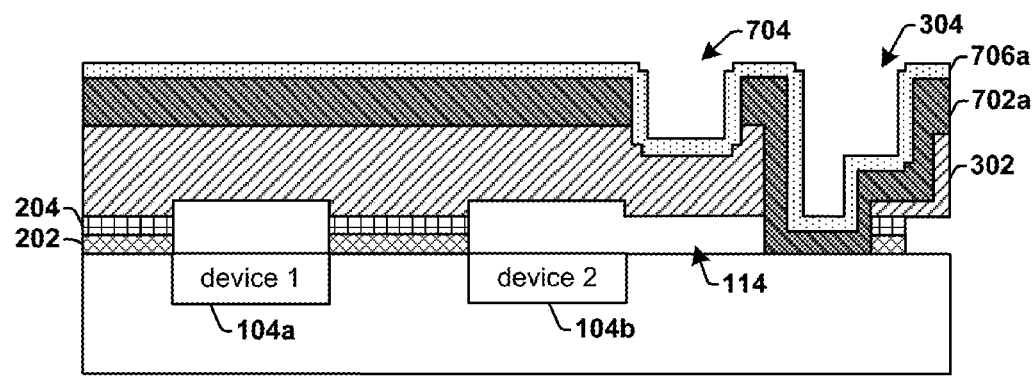
Figure 7B:
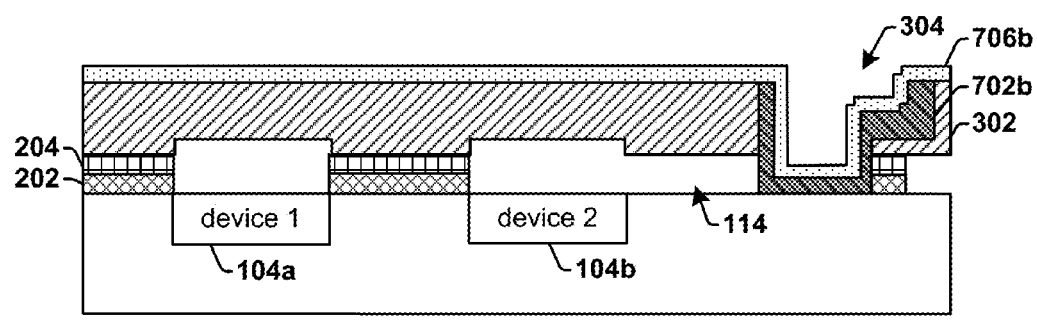

FIGS. 7A-7B illustrates cross-sectional views, 700a and 700b, of some alternative embodiments of a MEMs substrate comprising a shielding layer. As shown in FIGS. 7A-7B, a shielding layer 706 abuts an upper surface of a cap substrate 302 and extends into a vent hole 304 having stepped sidewalls. In some embodiments, the shielding layer 706 may extend through an opening 704 in a sealant 702a (shown in cross-sectional view 700a of FIG. 7A), while in other embodiments, the shielding layer may abut upper surfaces of the cap substrate 302 and the sealant 702b (shown cross-sectional view 700b of in FIG. 7B). It will be appreciated that the cross-sectional views of FIGS. 6A-6B and 7A-7B are non-limiting examples of shielding layer configurations.

Figure 8A:
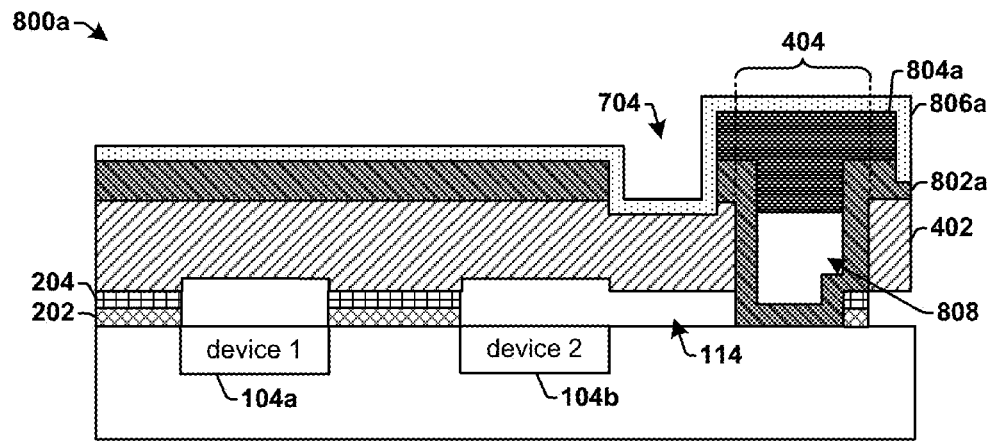
FIGS. 8A-8B illustrate some embodiments of a MEMs substrate having an additional capping structure disposed within one or more vent holes.
Figure 8B:
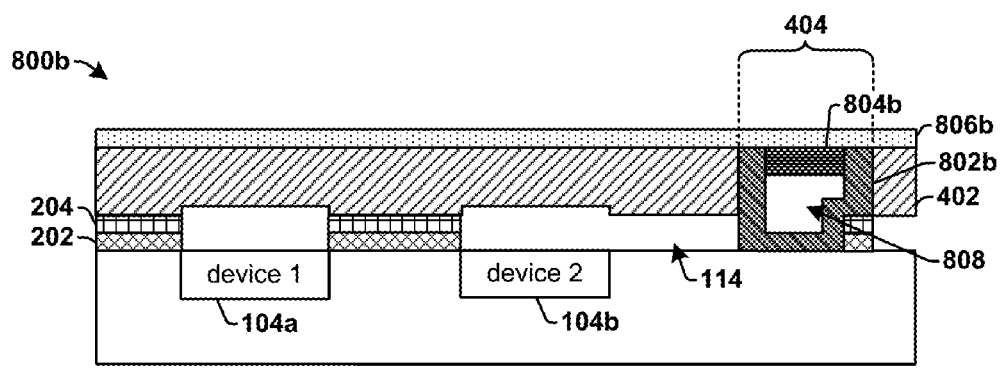

FIGS. 8A-8B illustrate some embodiments of cross-sectional views, 800a and 800b, of a MEMs substrate having an additional capping structure disposed within one or more vent holes.

The additional capping structure 804 is formed within one or more vent holes 404 at a position overlying a sealant 802. A shielding layer 806 is formed over the sealant 802 and the additional capping structure 804. In some embodiments, a cavity 808 may be arranged within the one or more vent holes 404 at a position that is laterally between sidewalls of the sealant 802 and vertically between the sealant 802 and the additional capping structure 804. The additional capping structure 804 prevents debris from subsequent processing steps from accumulating within the one or more vent holes 404. In some embodiments, the additional capping structure 804 may comprise a polymer material.

In some embodiments, shown in cross-sectional view 800a of FIG. 8A, the additional capping structure 804a extends outward from within the one or more vent holes 404 to a location that overlies an upper surface of the sealant 802a. In other embodiments, shown in cross-sectional view 800b of FIG. 8B, the additional capping structure 804b has an upper surface that is substantially aligned with an upper surface of the cap substrate 402 and the sealant 802b. In such embodiments, the shielding layer 806b is substantially flat.

Figure 9:
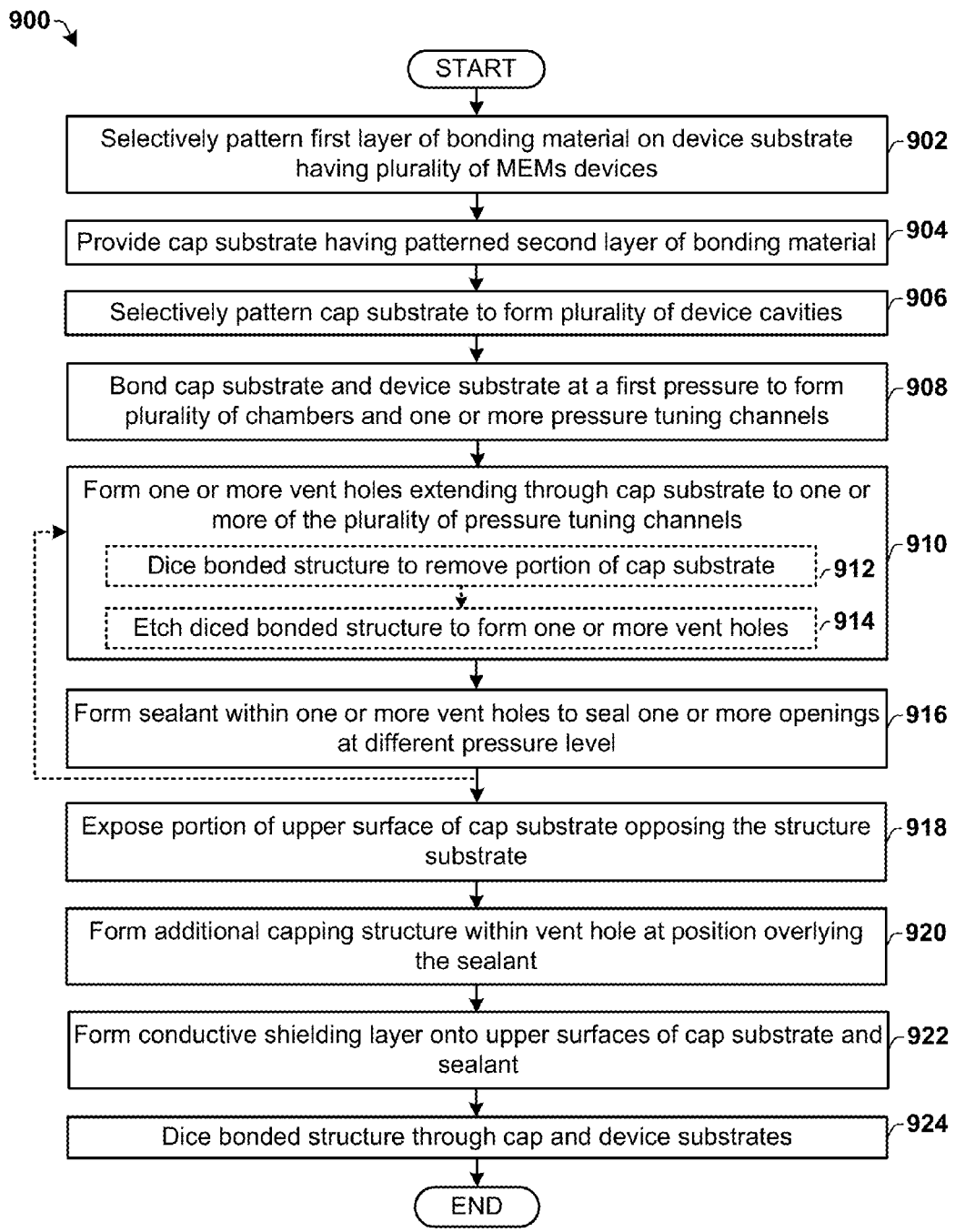
FIG. 9 illustrates a flow diagram of some embodiments of a method of forming a plurality of MEMs devices abutting chambers held at different pressures on a substrate.

FIG. 9 illustrates a flow diagram of some embodiments of a method 900 for forming a plurality of MEMs device having chambers with different pressures on a substrate.

While disclosed method 900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 902, a first layer of bonding material is selectively patterned on a device substrate having plurality of MEMs devices. The plurality of MEMs devices are disposed between the selectively patterned first layer of bonding material.

At 904, a cap substrate is provided having a patterned second layer of bonding material.

At 906, the cap substrate is selectively patterned to form a plurality of device cavities at positions located between the patterned second layer of bonding material. In some embodiments, the cap substrate may be patterned to also form one or more pressure tuning cavities.

At 908, the cap substrate is bonded to the device substrate at a first pressure. Bonding the cap substrate to the device substrate forms a plurality of chambers and one or more pressure tuning channels. The cap substrate is bonded to the device substrate by bringing the first layer of bonding material into contact with the second layer of bonding material at a first ambient environment having the first pressure.

At 910, one or more vent holes are formed within the cap substrate. The one or more vent holes are in communication with one or more of the pressure tuning channels and expose the one or more of the plurality of chambers to a second ambient environment having a second pressure.

In some embodiments, the one or more vent holes are formed by removing a portion of the cap substrate by dicing the bonded structure (i.e., the cap substrate and the device substrate), at 912. The diced bonded structure is then etched to form the one or more vent holes that expose the one or more of the plurality of chambers to the second ambient environment having a second pressure, at 914. In other embodiments, the one or more vent holes may be formed by selectively etching the cap substrate according to a masking layer.

At 916, the one or more vent holes are sealed at a third pressure. In some embodiments the one or more chambers are sealed by depositing a sealant into the one or more vent holes within a third ambient environment having the third pressure. In some embodiments, the second pressure (i.e., the pressure of the second ambient environment during the opening process at 910) may be the same as the third pressure (i.e., the pressure of the ambient environment during the sealing process at 916). In other embodiments, the second pressure and the third pressure may be different.

At 918, an additional capping structure may be formed within the one or more vent holes, in some embodiments.

At 920, a portion of the sealant is removed to expose an upper surface of the cap substrate.

At 922, a conductive shielding layer is formed onto and in direct contact with an upper surface of the cap substrate and an upper surface of the sealant.

At 924, the bonded structure may be diced. In some embodiments, the bonded structure is diced to form a first MEMs device on a first die and a second MEMs device on a second die. In other embodiments, the bonded structure is diced to form the first and second MEMs device on a same die.

FIGS. 10-19 illustrate some embodiments of a substrate upon which a method 900 forming a plurality of MEMs device having chambers with different pressures on a substrate, is performed. Although FIGS. 10-19 are described in relation to method 900, it will be appreciated that the structures disclosed in FIGS. 10-19 are not limited to such a method, but instead may stand alone as a structure.

FIG. 10 illustrates some embodiments of a cross-sectional view 1000 (along cross-sectional line 1000a) and a top-view 1002 corresponding to act 902. As shown, a device substrate 102 is provided having a plurality of MEMs devices, 104a and 104b. In some embodiments, the device substrate 102 may comprise a silicon wafer. In some embodiment, device substrate 102 may comprise CMOS substrate having CMOS devices (e.g., MOSFET devices). In some embodiments, the plurality of MEMs devices, 104a and 104b, may comprise a MEMs gyroscope (e.g., a vibrating gyroscope) or a MEMs accelerometer. In other embodiments, the plurality of MEMs devices, 104a and 104b, may comprise a MEMs accelerometer or a MEMs pressure sensor.

The MEMs devices, 104a and 104b, are laterally positioned between a first layer of bonding material 202 disposed on a top surface of the device substrate 102. In some embodiments, the first layer of bonding material 202 can be aluminum or germanium for a eutectic bond, oxide for a fusion bond, or a metal or a polymer for a thermal compression bond. In other embodiments, the first layer of bonding material 202 may be omitted (e.g., for fusion bonding between a second layer of bonding material comprising an oxide and silicon)

FIG. 11 illustrates some embodiments of a cross-sectional view 1100 (along cross-sectional line 1100a) and a top-view 1104 corresponding to act 904. As shown in cross-sectional view 1100, a second layer of bonding material 204 is selectively formed over a cap substrate 1102. In some embodiments, the cap substrate 1102 may comprise a silicon wafer. In some embodiments, the second layer of bonding material 204 may comprise aluminum or germanium for a eutectic bond, oxide for a fusion bond, or a metal or a polymer for a thermal compression bond. In other embodiments, the second layer of bonding material 204 may be omitted (e.g., for fusion bonding between a first layer of bonding material comprising an oxide and silicon).

As shown in top-view 1104, the second layer of bonding material 204 is disposed over the cap substrate 1102 in a first pattern comprising substantially rectangular pattern, and in a second pattern comprising a substantially rectangular pattern with finger-like conduits (corresponding to pressure tuning channels formed at 908) extending outward from the rectangular pattern. In other embodiments, the second layer of bonding material 204 may be disposed in first and second patterns that are non-rectangular.

Figure 12:
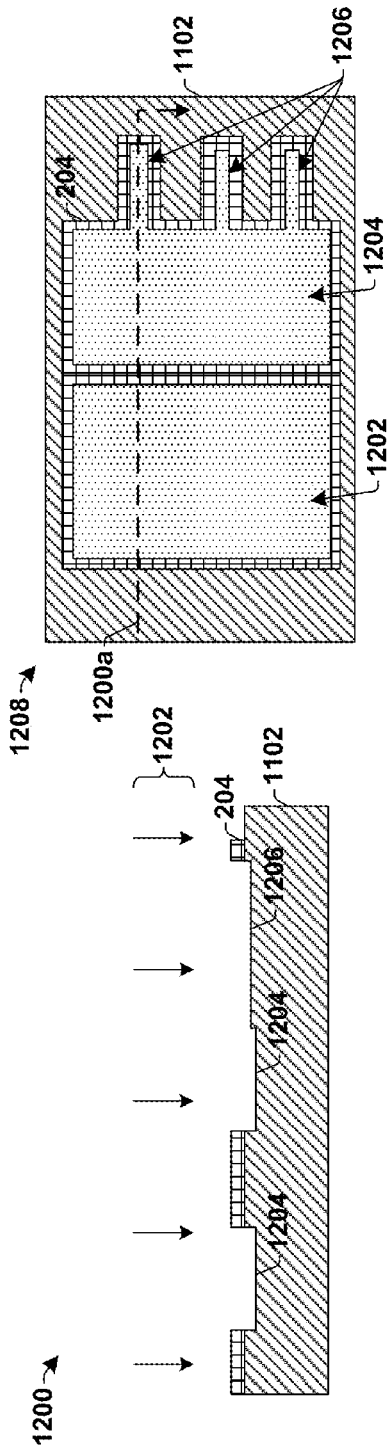

FIG. 12 illustrates some embodiments of a cross-sectional view 1200 (along cross-sectional line 1200a) and a top-view 1208 corresponding to act 906.

As shown in cross-sectional view 1200, the cap substrate 1102 is selectively pattered to form a plurality of depressions within the surface of the cap substrate 1102. In some embodiments, the cap substrate 1102 may be selectively patterned using a dry reactive ion etching (DRIE) process. For example, a masking layer (not shown) may be formed on to the cap substrate 1102 and then the cap substrate 1102 may be exposed to the dry etchant 1202 that selectively removes parts of the cap substrate 1102 in areas not masked by the masking layer.

In some embodiments, the plurality of depressions may comprise a plurality of device cavities 1204. In some additional embodiments, the plurality of depressions may further comprise one or more pressure tuning cavities 1206 that extend outward from one or more of the plurality of device cavities 1204. In some embodiments, the one or more pressure tuning cavities 1206 may comprise finger-like cavities. In other embodiments, the one or more pressure tuning cavities 1206 may comprise other shapes (e.g., non-finger-like cavities).

Figure 13:
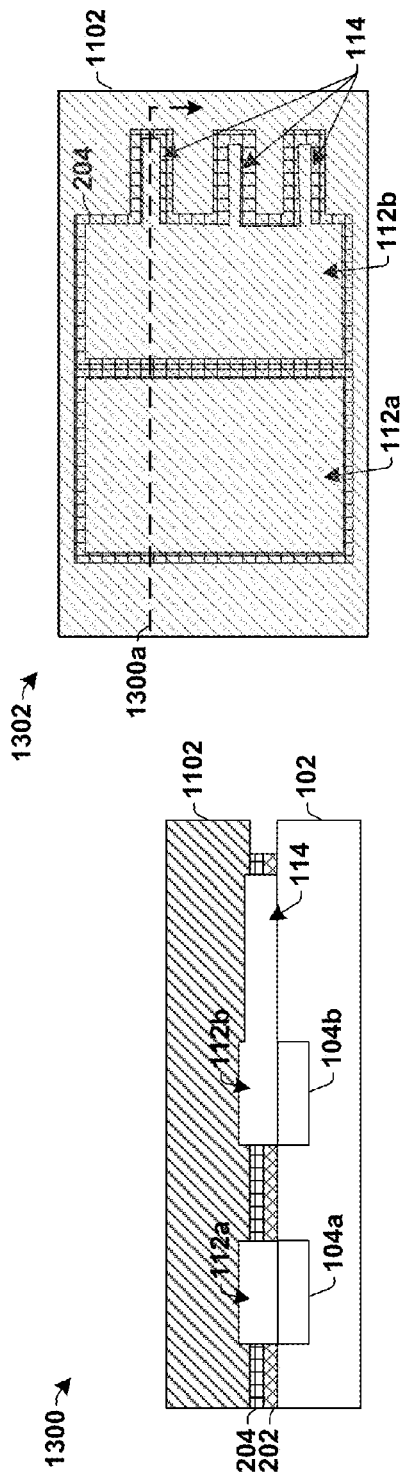

FIG. 13 illustrates some embodiments of a cross-sectional view 1300 (along cross-sectional line 1300a) and a top-view 1302 corresponding to act 908.

As shown in cross-sectional view 1300, the cap substrate 1102 is bonded to the device substrate 102 within a first ambient environment having a first pressure to form a bonded structure. The bonded structure comprises a first chamber 112a, a second chamber 112b, and one or more pressure tuning channels 114, held at the first pressure. The cap substrate 1102 is bonded to the device substrate 102 by bringing the first layer of bonding material 202 into contact with the second layer of bonding material 204. In some embodiments, the first pressure may be in a range of between approximately 1 milli-torr (mtorr) approximately 2 atmosphere. In various embodiments, the cap substrate 1102 may be bonded to the device substrate 102 by way of a fusion bonding process, an eutectic bonding process, or a thermal compression bonding process.

In some embodiments, the one or more pressure tuning channels 114 may comprise the pressure tuning cavities. In other embodiments, the one or more pressure tuning channels 114 may be formed by a patterned bonding material (e.g., first and second layers of bonding material, 202 and 204) that forms the one or more pressure tuning channels 114 disposed between the cap substrate 1102 and the device substrate 102.

Figure 14A:
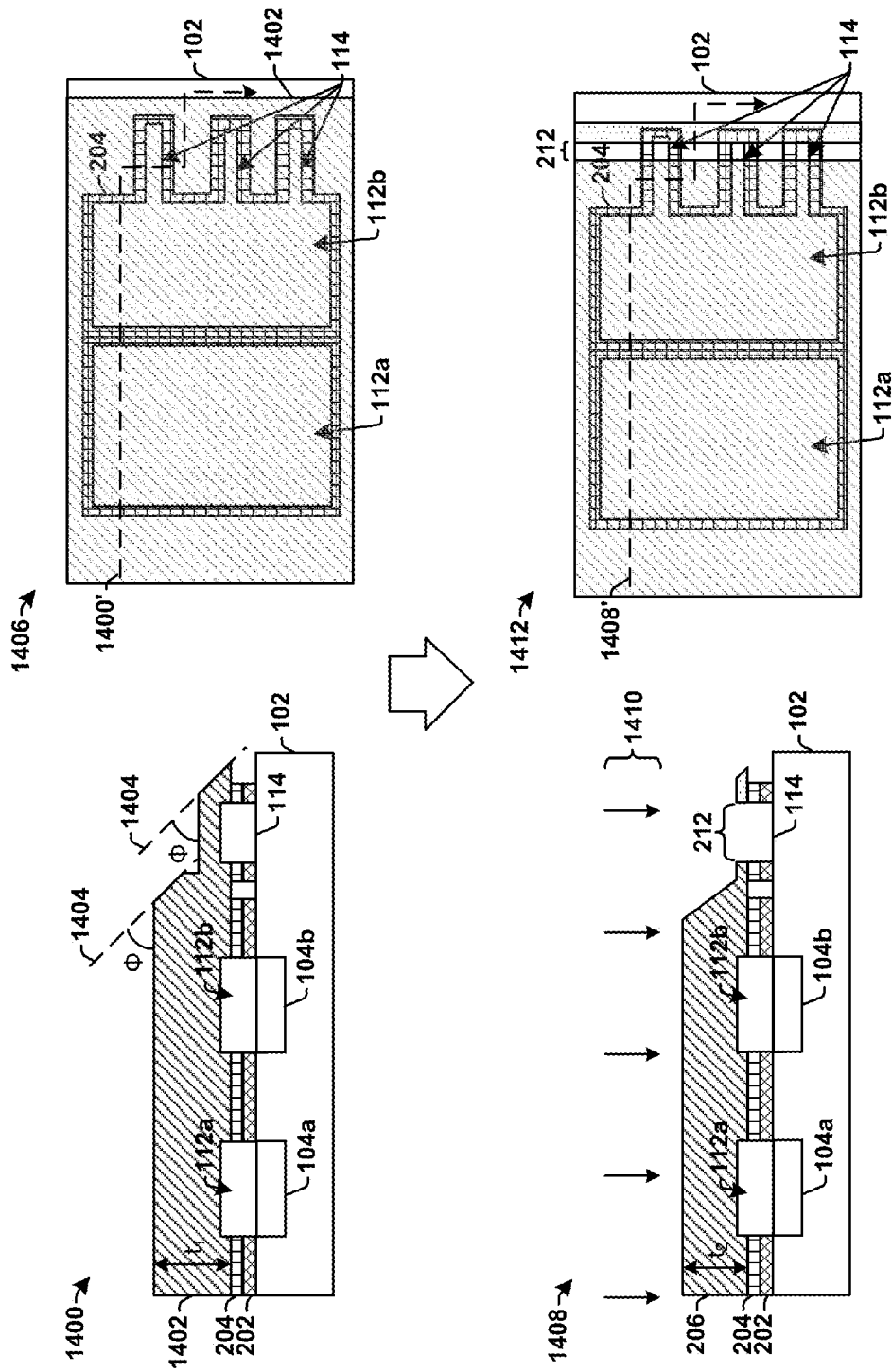
Figure 14B:
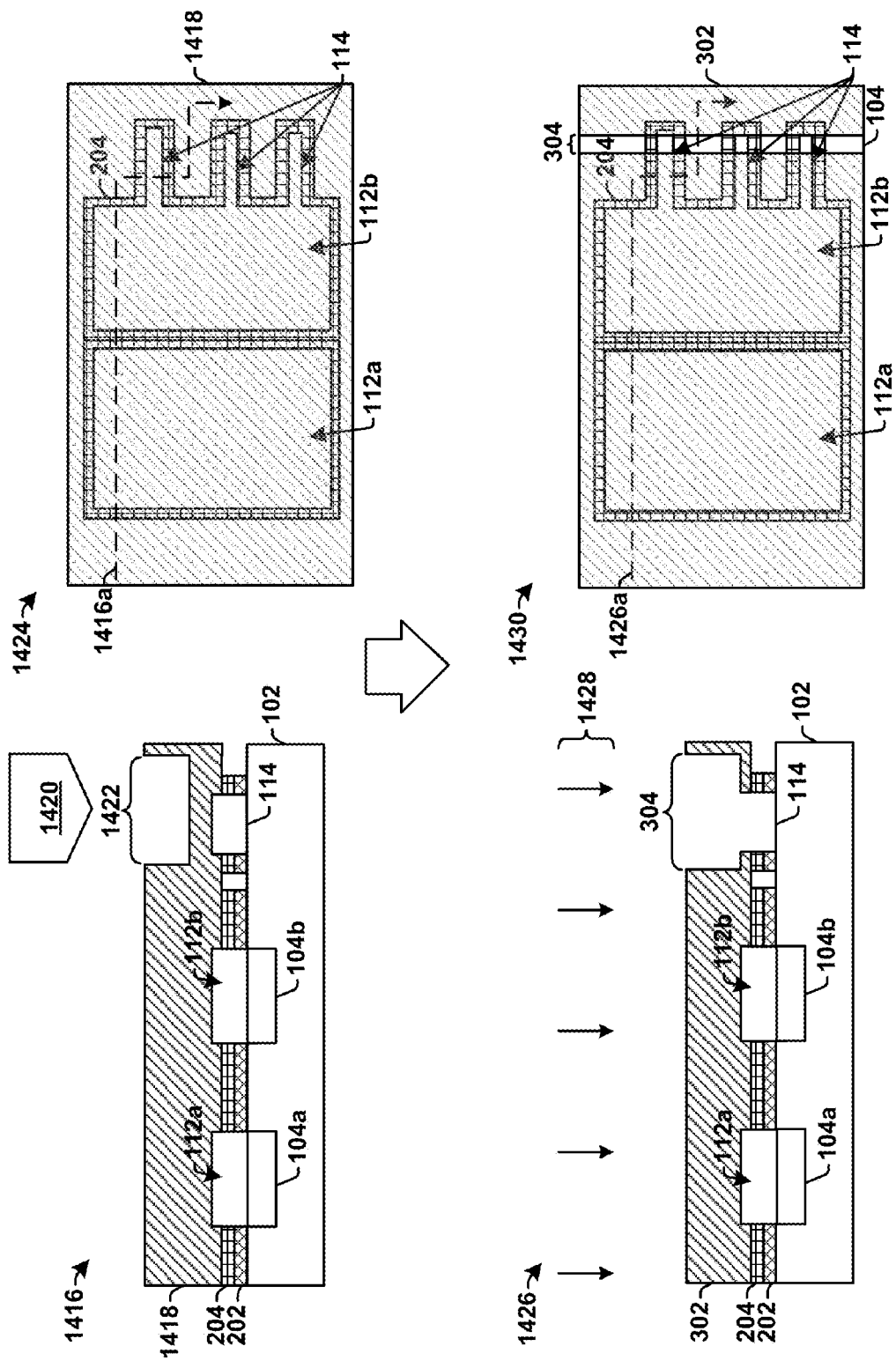
Figure 14C:
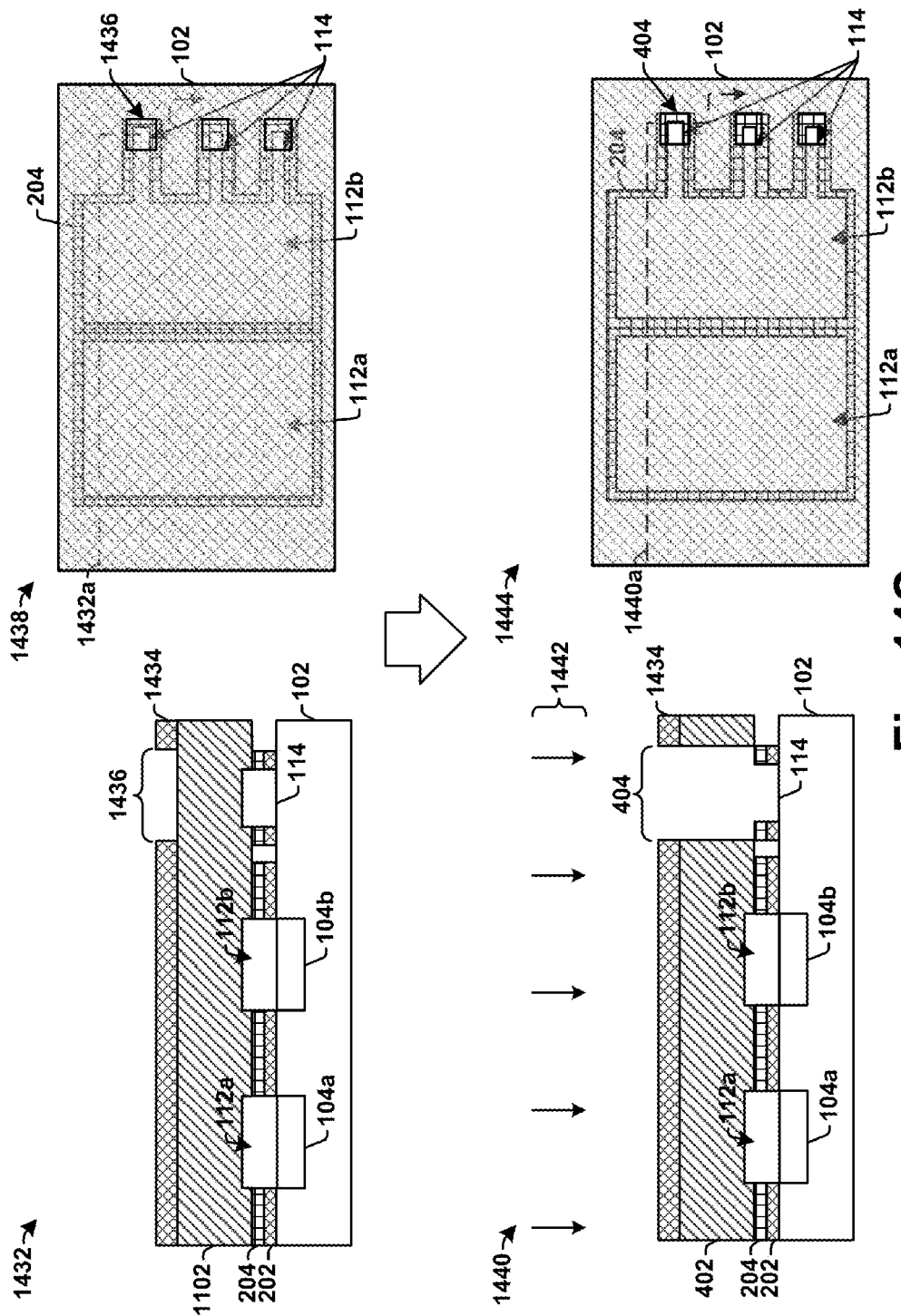

FIGS. 14A-14C illustrate various embodiments of a process of forming one or more vent holes corresponding to act 910.

FIG. 14A illustrates some embodiments of a process of forming one or more vent holes using a dicing process performed with a tilt dicer and a subsequent etching process.

As shown in cross-sectional view 1400, the cap substrate 1402 is diced along scribe line 1404 (note that the flat part of cap substrate 1402 between angled sidewalls corresponds to vertical part of cross-sectional line 1400') by a tilt dicer having a spindle that is tiled to an angle φ (corresponding to a sidewall angle of cap substrate 108). In some embodiments, the angle φ is in a range of between approximately 45° and 90°. The dicing process removes a portion of the cap substrate 108, providing the cap substrate 108 with an angled sidewall overlying the one or more pressure tuning channels 114. In some embodiments, shown in top-view 1406, the dicing process removes a portion of the cap substrate 1402 so that an angled sidewall of the cap substrate 1402 is set back from an edge of the device substrate 102.

As shown in cross-sectional view 1408, after dicing the cap substrate 206 is exposed to a blanket (i.e., unmasked) etching process. The blanket etching process exposes an upper surface of the cap substrate 1402 to an etchant 1410 that removes a portion of the cap substrate 206 to form one or more vent holes 212 that connect the one or more pressure tuning channels 114 to a second ambient environment held at a second pressure. In some embodiments, the pressure tuning cavities 114 cause a portion of the cap substrate 206 to remain to the right of the vent hole 212 as shown in cross-sectional view 1408. In other embodiments, the cap substrate 206 may be removed to the right of the vent holes 212. As shown in top-view 1412, the one or more vent holes 212 may comprise a trench extending over multiple pressure tuning channels 114.

In some embodiments, the etchant 1410 may comprise a dry etchant. In some embodiments, the dry etchant may use an etching chemistry comprising chlorine ($Cl_2$) or Sulfur hexafluoride ($SF_6$), for example. Since the blanket etching process exposes the cap substrate 1402 to etchant 1410, the thickness of the cap substrate is reduced from a first thickness $t_1$ to a second thickness $t_2$ (where $t_2 < t_1$).

By forming one or more vent holes 212 that connect the one or more pressure tuning channels 114 to the second ambient environment, the second chamber 112b may be brought to the second pressure that is different than the first pressure.

FIG. 14B illustrates some alternative embodiments of a process that forms one or more vent holes using a dicing process performed with a non-tilt dicer and a subsequent etching process.

As shown in cross-sectional view 1416, the cap substrate 1418 is diced by a non-tilted dicing blade 1420. The non-tilted dicing blade 1420 makes a cut into the cap substrate 1418 that is substantially perpendicular to the upper surface of the cap substrate 1418. The dicing process removes a portion of the cap substrate 1418 to from a depression 1422 within the cap substrate 1418 overlying the one or more pressure tuning channels 114.

As shown in top-view 1424, the portion of the cap substrate 1418 removed by the non-tilted dicing blade 1420 forms a trench that extends between a plurality of pressure tuning channels 414.

As shown in cross-sectional view 1426, after dicing the cap substrate 302 is exposed to a blanket (i.e., unmasked) etching process. The blanket etching process exposes an upper surface of the cap substrate 302 to an etchant 1428 that removes a portion of the cap substrate 302 to form one or more vent holes 304 that connect the one or more pressure tuning channels 114 to a second ambient environment held at a second pressure. In some embodiments, the pressure tuning cavities 1206 cause a portion of the cap substrate 302 to remain to the right of the vent hole 304 as shown in cross-sectional view 1426. In other embodiments, the cap substrate 302 may be removed to the right of the vent holes 304. By forming one or more vent holes 304 that connect the one or more pressure tuning channels 114 to the second ambient environment, the second chamber 112b may be brought to the second pressure that is different than the first pressure.

FIG. 14C illustrates some alternative embodiments of a process that forms one or more vent holes using an etching process.

As shown in cross-sectional view 1432, a masking layer 1434 is selectively formed onto an upper surface of the cap substrate 1102. The masking layer 1434 comprises one or more openings 1436 that defines locations of one or more vent holes. As shown in top-view 1438, separate openings may be formed over each of the pressure tuning channels 114.

As shown in cross-sectional view 1440, the cap substrate 402 is selectively exposed to an etchant 1442 in areas that are not masked by the masking layer 1434. The etchant 1442 is configured to remove a portion of the cap substrate 402 to form one or more vent holes 404 that connect the one or more pressure tuning channels 114 to a second ambient environment held at a second pressure. By forming one or more vent holes 404 that connect the one or more pressure tuning channels 114 to the second ambient environment, the second chamber 112b is exposed the second pressure.

Figure 15A:
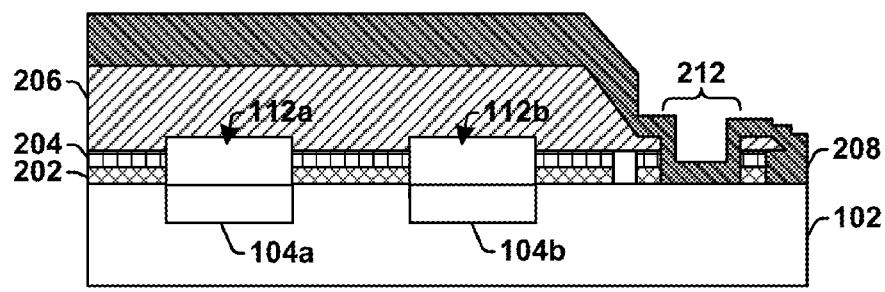
Figure 15B:
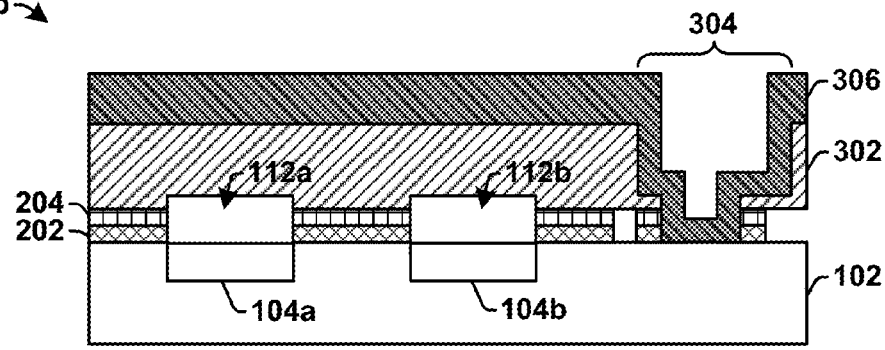
Figure 15C:
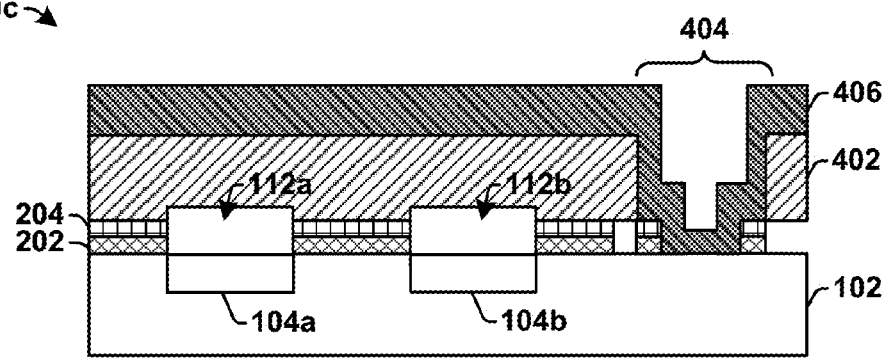

FIG. 15A-15C illustrates some embodiments of cross-sectional views 1500a-1500c corresponding to act 916.

As shown in cross-sectional view 1500a, a sealant 208 is formed within one or more vent holes 212 formed by a tilt dicing process (as shown in FIG. 14A) within a third ambient environment having a third pressure. In some embodiments, the sealant 208 may comprise a metal or a dielectric material. In some embodiments, the sealant 208 may comprise a metal layer stacked onto a dielectric layer. In other embodiments, the sealant 208 may comprise a sandwich structure having a metal layer disposed between two dielectric layers. In some embodiments, the layers of the sealant 208 may be deposited by way of a deposition technique (e.g., chemical vapor deposition, physical vapor deposition, etc.). In various embodiments, the second pressure and the third pressure may be the same or the second pressure and the third pressure may be different.

As shown in cross-sectional view 1500b, a sealant 306 is formed within one or more vent holes 304 formed by a non-tilted dicing process (as shown in FIG. 14B) within a third ambient environment having a third pressure. In various embodiments, the sealant 208 may comprise a metal and/or a dielectric material.

As shown in cross-sectional view 1500c, a sealant 406 is formed within one or more vent holes 404 formed by an etching process (as shown in FIG. 14C) within a third ambient environment having a third pressure. In various embodiments, the sealant 406 may comprise a metal and/or a dielectric material.

Figure 16:
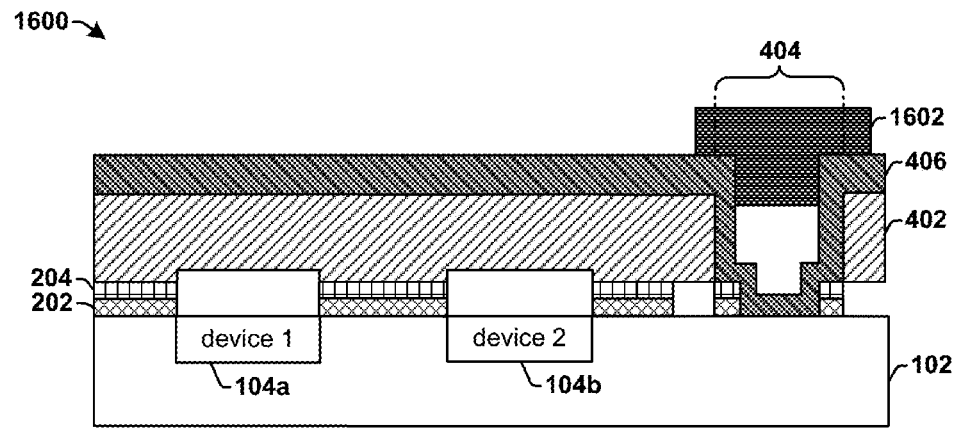

FIG. 16 illustrates some embodiments of a cross-sectional view 1600 corresponding to act 918.

As shown in cross-sectional view 1600, an additional capping structure 1602 is formed within one or more vent holes 404. The additional capping structure 1602 may comprise a polymer material (e.g., an epoxy) that is formed within the one or more vent holes 404. The additional capping structure 1602 prevents debris from subsequent processing steps from accumulating within the one or more vent holes 404. In some embodiments, the additional capping structure 1602 may comprise a polymer based film formed by a screen printing process, for example. In some alternative embodiments, the additional capping structure 1602 may be formed subsequent to the acts of FIGS. 17A-17C.

Figure 17A:
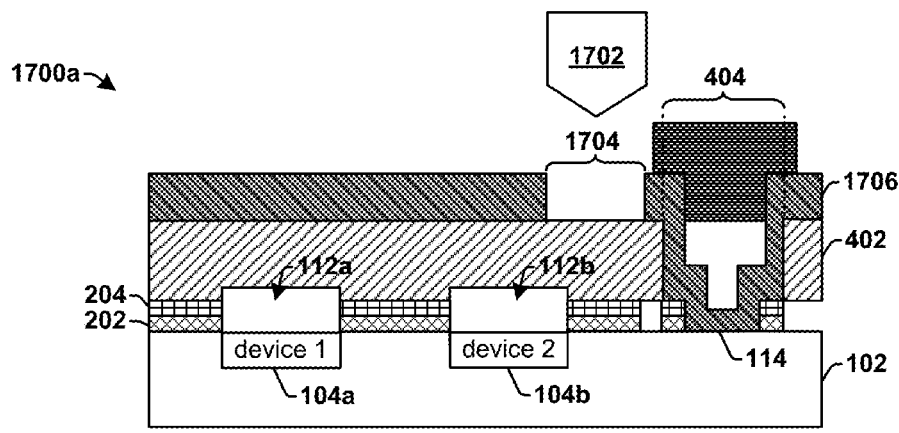
Figure 17B:
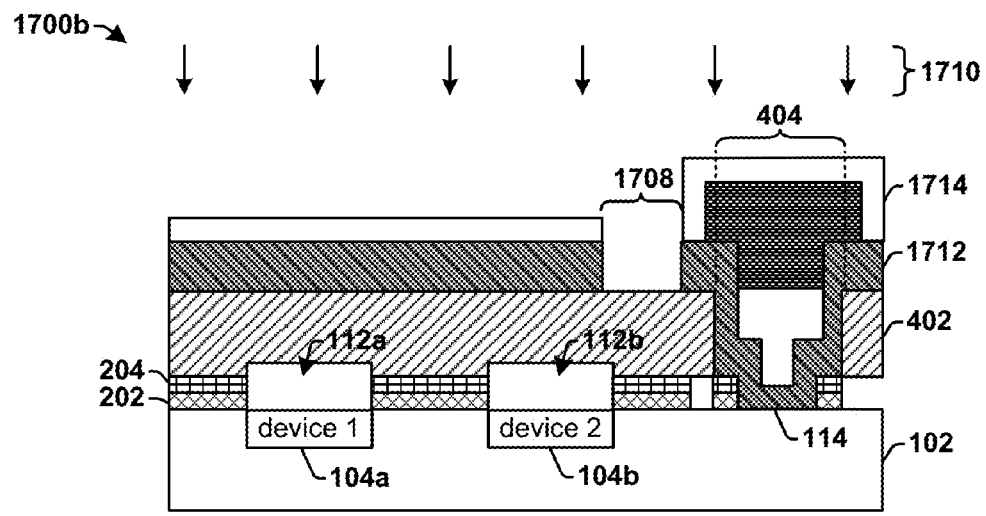
Figure 17C:
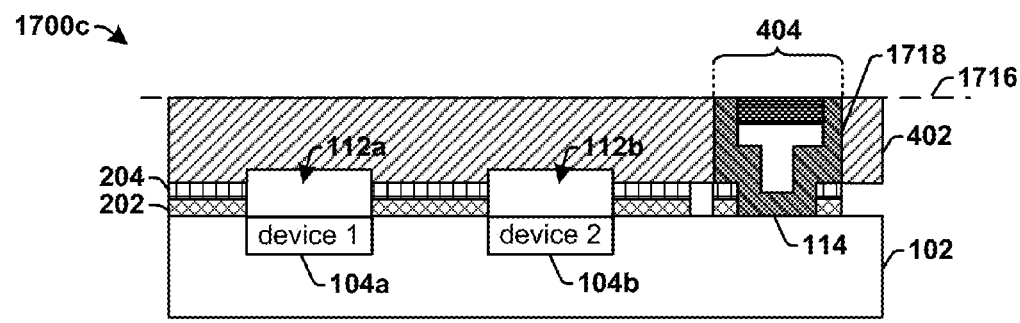

FIG. 17A-17C illustrates some embodiments of cross-sectional view 1700a-1700c corresponding to act 920. As shown in FIGS. 17A-17C, a portion of the sealant is removed to expose an upper surface of the cap substrate. The removal of the sealant can be selective or nonselective. In the various embodiments shown in FIG. 17A-17C, the sealant is shown as being removed by dicing (FIG. 17A), etching (FIG. 17B), or grinding (FIG. 17C), however, one of ordinary skill in the art will appreciate that other methods may be used to remove the sealant.

As shown in cross-sectional view 1700a, a portion of the sealant 1706 is removed by a dicing process (e.g., using dicing blade 1702) to form an opening 1704 extending through the sealant 1706 to expose a portion of an upper surface of the cap substrate 402. The opening 1704 has a width that is substantially equal to a width of the dicing blade (e.g., between approximately 5 um and approximately 100 um).

As shown in cross-sectional view 1700b, a portion of the sealant 1712 is removed by an etching process to expose a portion of an upper surface of the cap substrate 402. The etching process is performed by forming a masking layer 1714 over the sealant 1712. In some embodiments, the masking layer 1714 may comprise a photoresist layer patterned according to a photolithography process. The sealant 1712 is subsequently exposed to an etchant 1710 according to the masking layer 1714. The etchant 1710 removes exposed portions of the sealant 1712 to form an opening 1708 extending through the sealant 1712 to the underlying cap substrate 402.

As shown in cross-sectional view 1700c, a portion of the sealant 1718 is removed by a grinding process to expose a portion of an upper surface of the cap substrate 402. In some embodiments, the grinding process may comprise a chemical mechanical polishing (CMP) process. In other embodiments, the grinding process may comprise a mechanical grinding process that removes polymer material and silicon at the same time with sealant. The CMP process or mechanical grinding process forms a substantially planar surface 1716 that extends along an upper surface of the cap substrate 402 and along an upper surface of the sealant 1718.

Figure 18:
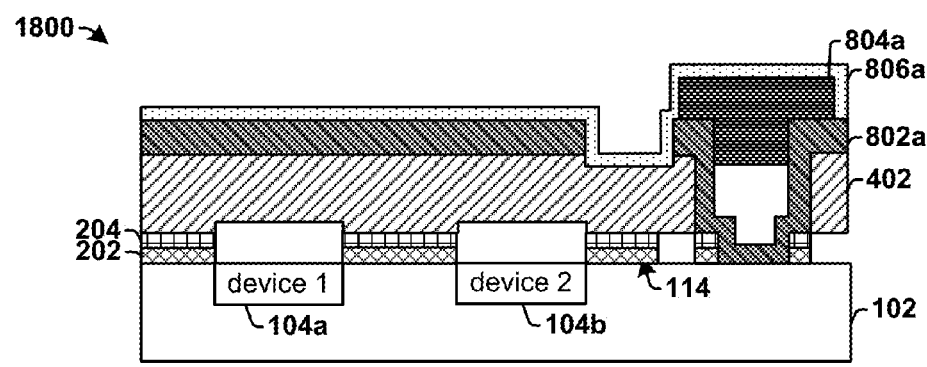

FIG. 18 illustrates some embodiments of a cross-sectional view 1000 corresponding to act 922.

As shown in cross-sectional view 1800, a conductive shielding layer 806a is formed onto and in direct contact with the upper surface of cap substrate 402 and an upper surface of the sealant 802a. In some embodiments, the conductive shielding layer 806a may be deposited by way of a vapor deposition technique (e.g., chemical vapor deposition, physical vapor deposition, etc.). In various embodiments, the conductive shielding layer 806a may comprise a metal such as aluminum or copper, for example.

Figure 19:
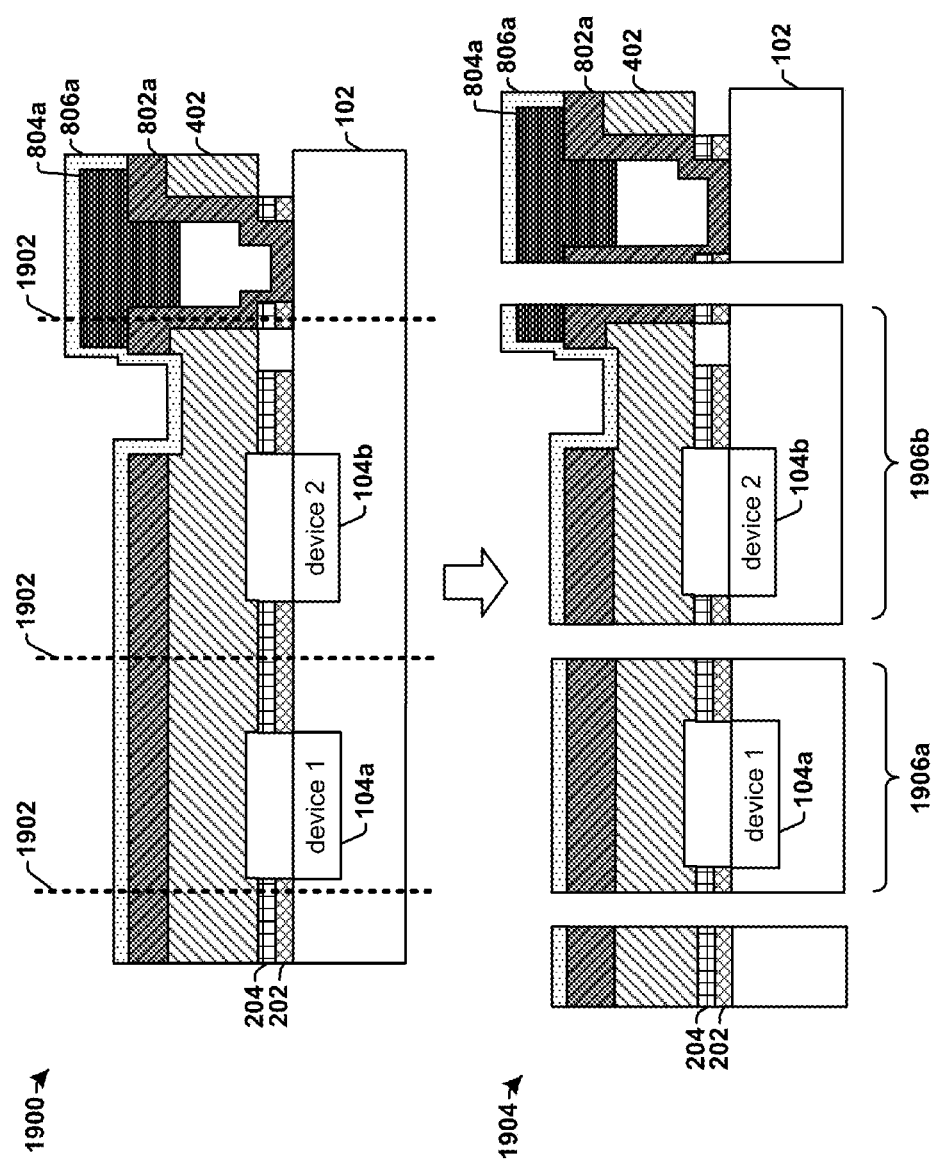

FIG. 19 illustrates some embodiments of cross-sectional views, 1900 and 1904, corresponding to act 924. As shown, the substrate may be diced along one or more of scribe lines 1902, using a non-tiled dicing saw, to form a single die 1906 comprising one or more of the plurality of MEMs devices, 104a and 104b, respectively abutting chambers having different pressures. For example, the substrate may be diced to form a first die 1906a comprising a first MEMs device 104a abutting a first chamber 112a held at the first pressure and a second die 1906b comprising a second MEMs device 104b abutting a second chamber 112b held at the second pressure.

It will be appreciated that while reference is made throughout this document to exemplary structures in discussing aspects of methodologies described herein (e.g., the structure presented in FIGS. 10-19, while discussing the methodology set forth in FIG. 9), that those methodologies are not to be limited by the corresponding structures presented. Rather, the methodologies (and structures) are to be considered independent of one another and able to stand alone and be practiced without regard to any of the particular aspects depicted in the FIGS. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein The present disclosure relates to a MEMs (micro-electromechanical system) substrate having an electromagnetic shielding layer overlying a plurality of MEMs devices that respectively abut chambers held at different pressures, and an associated method of formation.

In some embodiments, the present disclosure relates to a MEMs (micro-electromechanical system) substrate. The MEMs substrate comprises a device substrate having a micro-electromechanical system (MEMs) device, and a layer of bonding material positioned over the device substrate at positions adjacent to the MEMs device. The MEMs substrate further comprises a cap substrate comprising a depression disposed within a surface abutting the layer of bonding material, which forms a chamber vertically disposed between the device substrate and the cap substrate and abutting the MEMs device. One or more pressure tuning channels vertically disposed between the device substrate and the cap substrate laterally extend outward from a sidewall of the chamber.

In other embodiments, the present disclosure relates to a MEMs (micro-electromechanical system) substrate. The MEMs substrate comprises a device substrate having a micro-electromechanical system (MEMs) device, and a layer of bonding material positioned over the device substrate at positions adjacent to the MEMs device. A cap substrate comprising a depression disposed within a surface abuts the layer of bonding material, to form a chamber vertically disposed between the device substrate and the cap substrate and abutting the MEMs device. A sealant is disposed between the chamber and an ambient environment, and a conductive shielding layer extends from an upper surface of the sealant to an upper surface of the cap substrate.

In yet other embodiments, the present disclosure relates to a method of forming a plurality of MEMs devices on a shared substrate. The method comprises providing a device substrate comprising a plurality of micro-electromechanical system (MEMs) devices. The method further comprises bonding a cap substrate onto the device substrate in a first ambient environment having a first pressure, wherein the bonding forms a plurality of chambers abutting the plurality of MEMs devices. The method further comprises forming one or more vent holes extending through the cap substrate to locations in communication with the plurality of chambers. The method further comprises forming a sealant within the one or more vent holes in a second ambient environment having a second pressure. The method further comprises selectively removing the sealant to expose a portion of an upper surface of the cap substrate, and forming a conductive shielding layer extending from an upper surface of the sealant to the upper surface of the cap substrate.

What is claimed is:

1. A MEMs (micro-electromechanical system) substrate, comprising:
   a device substrate having a micro-electromechanical system (MEMs) device;
   a layer of bonding material positioned over the device substrate at positions adjacent to the MEMs device;
   a cap substrate comprising a depression disposed within a surface abutting the layer of bonding material, which forms a chamber vertically disposed between the device substrate and the cap substrate and abutting the MEMs device; and
   one or more pressure tuning channels vertically disposed between the device substrate and the cap substrate and laterally extending outward from a sidewall of the chamber, wherein the one or more pressure tuning channels comprise one or more openings arranged within upper horizontal surfaces of the one or more pressure tuning channels.

2. The substrate of claim 1, further comprising:
   one or more vent holes vertically extending through the cap substrate to the one or more openings; and
   a sealant that extends from over the cap substrate to within the one or more vent holes.

3. The substrate of claim 2, wherein the sealant contacts a sidewall of the layer of bonding material that faces the chamber.

4. The substrate of claim 2, further comprising:
   a conductive shielding layer extending from an upper surface of the sealant to an upper surface of the cap substrate.

5. The substrate of claim 4, further comprising:
   a first opening extending though the sealant from the upper surface of the sealant to the cap substrate, wherein the conductive shielding layer extends through the first opening to abut the cap substrate.

6. The substrate of claim 4,
   wherein the upper surface of the cap substrate is substantially co-planar with the upper surface of the sealant; and
   wherein the conductive shielding layer abuts the upper surface of the cap substrate and the upper surface of the sealant.

7. The substrate of claim 2, further comprising:
   an additional capping structure disposed within the one or more vent holes.

8. The substrate of claim 1, wherein a height of the pressure tuning channels is greater than or substantially equal to a height of the layer of bonding material.

9. The substrate of claim 1, wherein sidewalls of the one or more pressure tuning channels comprise the cap substrate and a bonding layer vertically disposed between the cap substrate and the device substrate.

10. A MEMs (micro-electromechanical system) substrate, comprising:
    a device substrate having a micro-electromechanical system (MEMs) device;
    a layer of bonding material positioned over the device substrate at positions adjacent to the MEMs device;
    a cap substrate comprising a depression disposed within a surface abutting the layer of bonding material, which forms a chamber vertically disposed between the device substrate and the cap substrate and abutting the MEMs device;
    a sealant disposed between the chamber and an ambient environment; and
    a conductive shielding layer extending from an upper surface of the sealant to an upper surface of the cap substrate.

11. The substrate of claim 10, further comprising:
    one or more pressure tuning channels laterally extending outward from a sidewall of the chamber.

12. The substrate of claim 11, further comprising:
    one or more vent holes extending through the cap substrate to locations in communication with the one or more pressure tuning channels.

13. The substrate of claim 10, wherein the sealant comprises a dielectric material abutting a metal layer.

14. The substrate of claim 10, wherein the sealant comprises a metal layer disposed between a first dielectric material and a second dielectric material.

15. The substrate of claim 10, further comprising:
    a first opening extending though the sealant from the upper surface of the sealant to the cap substrate, wherein the conductive shielding layer extends through the first opening to abut the cap substrate.

16. A method of forming a plurality of MEMs devices on a shared substrate, comprising:
    providing a device substrate comprising a plurality of micro-electromechanical system (MEMs) devices;
    bonding a cap substrate onto the device substrate in a first ambient environment having a first pressure, wherein the bonding forms a plurality of chambers abutting the plurality of MEMs devices;
    forming one or more vent holes extending through the cap substrate to locations in communication with the plurality of chambers;

forming a sealant within the one or more vent holes in a second ambient environment having a second pressure;

selectively removing the sealant to expose a portion of an upper surface of the cap substrate; and forming a conductive shielding layer extending from an upper surface of the sealant to the upper surface of the cap substrate.

17. The method of claim 16, wherein bonding the cap substrate onto the device substrate results in one or more pressure tuning channels that extend outward from the one or more of the plurality of chambers.

18. The method of claim 16, wherein the upper surface of the sealant is substantially co-planar with the upper surface of the cap substrate after removal of the portion of the sealant.

19. The method of claim 16, wherein selectively removing the sealant forms a first opening extending though the sealant from the upper surface of the sealant to the cap substrate; and wherein the conductive shielding layer extends through the first opening to abut the cap substrate.

20. The method of claim 16, wherein forming one or more vent holes comprises:

forming a masking layer over the cap substrate; and etching the cap substrate according to the masking layer to form the one or more vent holes.

\* \* \* \* \*